United States Patent
Ikegawa

(10) Patent No.: US 11,189,781 B2
(45) Date of Patent: Nov. 30, 2021

(54) MAGNETORESISTIVE STACK/STRUCTURE INCLUDING METAL INSERTION SUBSTANCE

(71) Applicant: EVERSPIN TECHNOLOGIES, INC., Chandler, AZ (US)

(72) Inventor: Sumio Ikegawa, Phoenix, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 309 days.

(21) Appl. No.: 16/029,938

(22) Filed: Jul. 9, 2018

(65) Prior Publication Data
US 2019/0013460 A1    Jan. 10, 2019

Related U.S. Application Data

(60) Provisional application No. 62/530,566, filed on Jul. 10, 2017.

(51) Int. Cl.
*H01L 43/02* (2006.01)
*G11C 11/16* (2006.01)
(Continued)

(52) U.S. Cl.
CPC ............ *H01L 43/02* (2013.01); *G11C 11/161* (2013.01); *H01F 10/329* (2013.01);
(Continued)

(58) Field of Classification Search
CPC ......... H01L 43/02; H01L 43/08; H01L 43/10; H01L 43/12; G11C 11/161;
(Continued)

(56) References Cited

U.S. PATENT DOCUMENTS

2005/0195534 A1*  9/2005  Gill ................... B82Y 25/00
                                                       360/324.12
2007/0085068 A1*  4/2007  Apalkov ............. H01F 10/3227
                                                       257/1
(Continued)

FOREIGN PATENT DOCUMENTS

WO    WO 2017/105488    6/2017

OTHER PUBLICATIONS

Koziol-Rachwal, A. et al., "Influence of ultrathin Cr insertion on perpendicular magnetic anisotropy and its electric field induced change at Fe/MgO interface," 61$^{st}$ Annual Conference on Magnetism and Magnetic Materials, Abstracts, Oct. 31-Nov. 4, 2016, p. 485, New Orleans, Louisiana.

(Continued)

*Primary Examiner* — Peter Bradford
(74) *Attorney, Agent, or Firm* — Bookoff McAndrews, PLLC

(57) ABSTRACT

A magnetoresistive device comprises a fixed magnetic region positioned on or over a first electrically conductive region, an intermediate layer positioned on or over the fixed magnetic region, a free magnetic region positioned on or over the intermediate layer, and a metal insertion substance positioned in contact with the free magnetic region, wherein the metal insertion substance includes one or more transition metal elements.

13 Claims, 7 Drawing Sheets

(51) Int. Cl.
  *H01L 43/10* (2006.01)
  *H01L 43/12* (2006.01)
  *H01F 10/32* (2006.01)
  *H01F 41/32* (2006.01)
  *H01L 43/08* (2006.01)

(52) U.S. Cl.
  CPC ..... *H01F 10/3254* (2013.01); *H01F 10/3272* (2013.01); *H01F 10/3286* (2013.01); *H01F 41/32* (2013.01); *H01L 43/08* (2013.01); *H01L 43/10* (2013.01); *H01L 43/12* (2013.01)

(58) Field of Classification Search
  CPC ............. H01F 10/3254; H01F 10/3272; H01F 10/3286; H01F 10/329; H01F 41/32
  See application file for complete search history.

(56) References Cited

U.S. PATENT DOCUMENTS

| | | | | |
|---|---|---|---|---|
| 2008/0113220 A1* | 5/2008 | Sun | ...................... | H01F 10/3254 428/800 |
| 2011/0049621 A1* | 3/2011 | Lotfi | ................. | H01L 29/66689 257/337 |
| 2011/0108937 A1* | 5/2011 | Reid | ................... | H01F 10/3254 257/421 |
| 2012/0182647 A1 | 7/2012 | Fuke et al. | | |
| 2012/0313191 A1* | 12/2012 | Whig | .................... | G11C 11/161 257/421 |
| 2013/0221460 A1* | 8/2013 | Jan | ........................ | H01F 41/307 257/421 |
| 2013/0307102 A1* | 11/2013 | Oh | .......................... | H01L 43/08 257/421 |
| 2013/0341743 A1* | 12/2013 | Singleton | ............. | G01R 33/098 257/421 |
| 2014/0084398 A1* | 3/2014 | Oguz | .................... | G11C 11/161 257/421 |
| 2014/0145792 A1 | 5/2014 | Wang et al. | | |
| 2015/0035031 A1* | 2/2015 | Kim | ...................... | G11C 11/161 257/295 |
| 2015/0102439 A1* | 4/2015 | Gan | ........................ | H01L 43/10 257/421 |
| 2015/0137287 A1* | 5/2015 | Kim | ...................... | H01L 43/02 257/421 |
| 2015/0221326 A1† | 8/2015 | Jung | | |
| 2015/0340600 A1* | 11/2015 | Kim | ...................... | H01L 27/228 257/421 |
| 2016/0027997 A1* | 1/2016 | Oh | .......................... | H01L 43/10 257/421 |
| 2017/0263854 A1* | 9/2017 | Sato | ....................... | G11C 11/161 |
| 2017/0294575 A1* | 10/2017 | Hu | ......................... | H01L 43/08 |
| 2017/0373246 A1* | 12/2017 | Wang | .................. | H01F 10/3286 |
| 2018/0076262 A1* | 3/2018 | Eeh | ........................ | H01L 43/08 |
| 2018/0301266 A1* | 10/2018 | Ou | ....................... | H03B 15/006 |
| 2020/0043536 A1* | 2/2020 | Kuo | ...................... | H01L 27/222 |

OTHER PUBLICATIONS

Koziol-Rachwal, A. et al., "Enhancement of perpendicular magnetic anisotropy and its electric field-induced change through interface engineering in Cr/Fe/MgO," Scientific Reports, Jul. 20, 2017, pp. 1-11, vol. 7:5993, www.nature.com/scientificreports.
International search report and written opinion dated Oct. 26, 2018, in corresponding application PCT/US2018/041295 (16 pages).

\* cited by examiner
† cited by third party

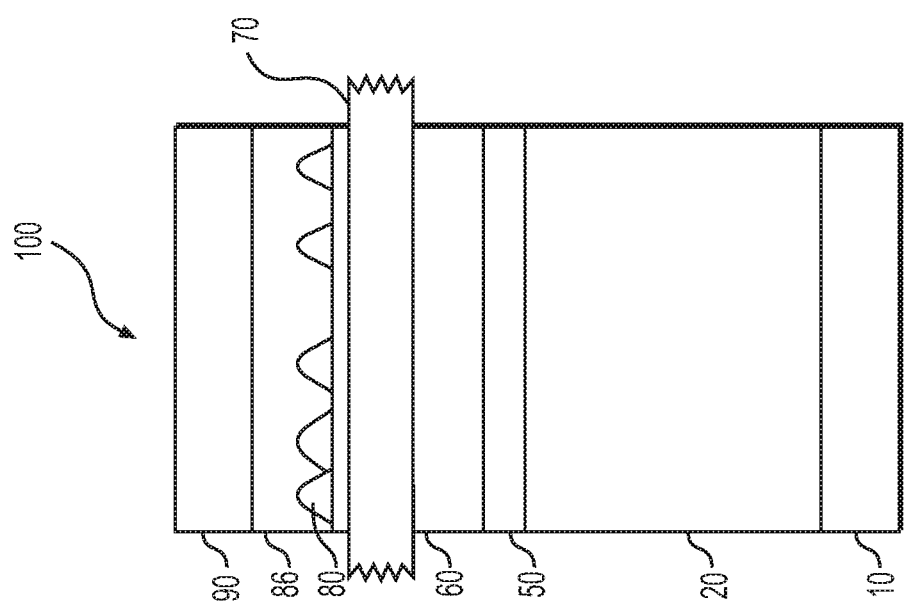
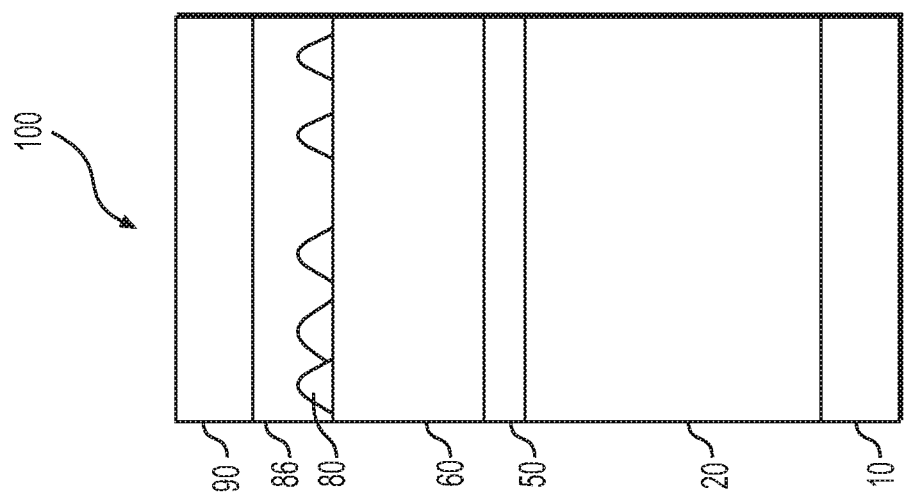

MAGNETORESISTIVE STACK/STRUCTURE INCLUDING METAL INSERTION SUBSTANCE

CROSS-REFERENCE TO RELATED APPLICATIONS

This application claims the benefit of U.S. Provisional Application No. 62/530,566, filed Jul. 10, 2017, the disclosure of which is incorporated herein by reference in its entirety.

TECHNICAL FIELD

The present disclosure relates to, among other things, embodiments and aspects of magnetoresistive stacks/structures and methods therefor, including methods of use and methods of manufacturing the disclosed magnetoresistive stacks/structures.

INTRODUCTION

There are many inventions described and illustrated herein, as well as many aspects and embodiments of those inventions. In one aspect, the present disclosure relates to a magnetoresistive stack/structure (for example, a magnetoresistive memory stack/structure or a magnetoresistive sensor/transducer stack/structure) and methods of manufacturing such a stack/structure. In one embodiment of this aspect of the disclosure, the described magnetoresistive stack/structure (for example, a magnetic tunnel junction (MTJ) stack/structure) includes an insertion layer having a material composition and an associated thickness, disposed on a region including one or more layers of magnetic or ferromagnetic materials, that improves the reliability, thermal stability, and/or thermal endurance of the magnetoresistive stack/structure.

For example, the insertion layer may include one or more metals, such as, e.g., transition metals, including, but not limited to, scandium, titanium, vanadium, chromium, manganese, copper, zinc, yttrium, zirconium, niobium, molybdenum, ruthenium, rhodium, palladium, silver, cadmium, indium, tin, antimony, lanthanum, cerium, praseodymium, neodymium, samarium, europium, terbium, dysprosium, holmium, erbium, ytterbium, lutetium, hafnium, tantalum, tungsten, rhenium, osmium, iridium, platinum, gold, mercury, thallium, lead, and bismuth. In addition, the insertion layer may include any metal that does not exhibit ferromagnetic properties when in a pure metal state at room temperature. The disclosed insertion layer may have a thickness less than or equal to 1 atomic layer for the material of the insertion layer. For example, in embodiments where the insertion layer includes chromium, the insertion layer may have a thickness ranging from approximately 0.2 angstrom (Å) to approximately 0.7 Å, from approximately 0.4 Å to approximately 0.6 Å, greater than approximately 0.2 Å, or less than approximately 0.7 Å. In those embodiments where the insertion layer includes iridium, the insertion layer may have a thickness of approximately 0.8 Å or less than approximately 2 Å. Layers with the aforementioned thickness properties may be referred to herein as monolayers.

In one embodiment, the disclosed insertion layer is implemented in an MTJ-type magnetoresistive stack/structure having a perpendicular magnetic anisotropy, wherein the MTJ-type structure maintains or includes improved properties (for example, thermally stable data retention capabilities (e.g., at relatively higher temperatures), magnetoresistance (MR) and resistance-area product (RA) of the stack/structure) after subsequent or additional processing (for example, annealing processes after deposition/formation of the magnetic region).

Notably, the embodiments described herein may employ any technique now known or later developed to manufacture the MTJ stack/structure including the formation and/or deposition of the described insertion layer; all such techniques are intended to fall within the scope of the present disclosure. In one embodiment, the described MTJ stack/structure may be implemented as a magnetoresistive memory stack/structure.

Briefly, a magnetoresistive memory stack/structure, in one embodiment, includes at least one non-magnetic layer (for example, at least one dielectric layer or at least one conductive) disposed between a "fixed" magnetic region/layer and a "free" magnetic region/layer, each including a plurality of layers of one or more magnetic or ferromagnetic materials. Information is stored in the magnetoresistive memory stack/structure by switching, programming, and/or controlling the direction of magnetization vectors in one or more of the magnetic layers of the "free" magnetic region/layer of the stack/structure. Here, the direction of the magnetization vectors of the "free" magnetic region/layer may be switched and/or programmed (for example, through spin transfer torque or spin-orbit torque) by application of a write signal (e.g., one or more current pulses) to or through the magnetoresistive memory stack/structure while, in contrast, the magnetization vectors in the magnetic layers of a "fixed" magnetic region/layer are magnetically fixed (in a predetermined direction).

The magnetoresistive memory stack/structure includes an electrical resistance that depends on the magnetic state of certain regions of the memory stack/structure. That is, when the magnetization vectors of the "free" magnetic region/layer are in a first state or in a first direction (for example, which is the same direction as the direction of the magnetization vectors of the "fixed" magnetic region/layer), the magnetoresistive memory stack/structure has a first magnetic state, which may correspond to a low electrical resistance state. Conversely, when the magnetization vectors of the "free" magnetic region/layer are in a second state or in a second direction (for example, which is a different direction (for example, opposite or opposing) as the direction of the magnetization vectors of the "fixed" magnetic region), the magnetoresistive memory stack/structure has a second magnetic state, which may correspond to a high electrical resistance state. The magnetic state of the magnetoresistive memory stack/structure is determined or read based on the resistance of the stack/structure in response to a read current of a read operation.

As alluded to above, the present disclosure is directed to, among other things, a magnetoresistive stack/structure—for example, a magnetoresistive memory stack/structure or a magnetoresistive sensor/transducer stack/structure including an insertion layer having a material composition and an associated thickness, disposed on a region including one or more layers of magnetic or ferromagnetic materials, such as, e.g., the "free" magnetic region described above. One, some, or all of the aspects described herein may facilitate an MTJ-type magnetoresistive stack/structure of the present disclosure to include and/or maintain improved characteristics or properties (for example, high temperature data retention capabilities, magnetoresistance (MR) and resistance-area product (RA) of the stack/structure), even after being exposed to elevated temperatures (e.g., approximately 170° C. to approximately 260° C.) during, e.g., reflow soldering process or implementation in an automotive applications. Indeed, a stack/structure including such an insertion layer may exhibit improved reliability, thermal stability and/or thermal endurance of the magnetoresistive stack/structure, for example, a magnetoresistive memory stack/structure.

Embodiments of the present disclosure also are directed to magnetoresistive integrated circuit devices (for example, a spin-torque MRAM) having one or more magnetoresistive stacks/structures (for example, a plurality of MTJ stacks/structures of a MTJ-based sensor/transducer device and/or MTJ-based memory device). Certain exemplary embodiments are described below.

In some embodiments, a magnetoresistive device is disclosed. The device may include a fixed magnetic region, a free magnetic region, and an intermediate layer disposed in between the fixed magnetic region and the free magnetic region. The device may also include one or more insertion material or substance disposed on or above the free magnetic region, wherein the insertion substance may include one or more transition metals, including, but not limited to, chromium (Cr), iridium (Ir), or alloys thereof. The insertion substance may be provided (e.g., via deposition) in a volume or quantity that is intended to create a thickness that is less than or equal to one monolayer thick. In actual practice, however, the provided volume or quantity may have a different thickness. Also, the substance may be provided in a non-uniform manner, such that, the substance does not provide a constant layer coating or covering on or above the free magnetic region. Indeed, in some areas, the lack of uniformity in providing the substance may leave portions of the free magnetic region devoid of the substance.

Different embodiments of the disclosed magnetoresistive devices may have one or more of the following aspects: the intermediate layer may include a dielectric material; the intermediate layer may include a conductive material; the fixed magnetic region may include a multilayer synthetic antiferromagnetic structure; the device may further include a capping layer disposed on or above the insertion elements, wherein the insertion elements is positioned between the capping layer and the free layer; the device may further include a second fixed region disposed on or above the insertion elements, wherein the insertion elements is positioned between the second fixed region and the free region.

In some embodiments, a method of manufacturing a magnetoresistive stack is disclosed. The method may include depositing a fixed magnetic region on an electrically conductive material; depositing a free magnetic region; depositing one or more intermediate layers in between the fixed magnetic region and the free magnetic region; and depositing one or more insertion elements on or above the free magnetic region, wherein the insertion elements include one of chromium and iridium and is less than or equal to one monolayer thick.

Different embodiments of the disclosed method may have one or more of the following aspects: further comprise depositing a second intermediate layer on or above the insertion elements; depositing a second fixed region on or above the second intermediate layer; the second intermediate layer may include a dielectric material; the intermediate layer may include a conductive material; the fixed magnetic region may include a multilayer synthetic antiferromagnetic structure.

Notably, although certain exemplary embodiments are described and/or illustrated herein in the context of MTJ stacks/structures, the present inventions may be implemented in giant magnetoresistive (GMR) stacks/structures where a conductor (e.g., copper) is disposed between two ferromagnetic regions/layers/materials. Indeed, the present inventions may be employed in connection with other types of magnetoresistive stacks/structures wherein such stacks/structures include a fixed magnetic region. For the sake of brevity, the discussions and illustrations will not be repeated specifically in the context of GMR or other magnetoresistive stacks/structures—but such discussions and illustrations are to be interpreted as being entirely applicable to GMR and other stacks/structures.

BRIEF DESCRIPTION OF THE DRAWINGS

Embodiments of the present disclosure may be implemented in connection with aspects illustrated in the attached drawings. These drawings show different aspects of the present inventions and, where appropriate, reference numerals illustrating like structures, components, materials and/or elements in different figures are labeled similarly. It is understood that various combinations of the structures, components, and/or elements, other than those specifically shown, are contemplated and are within the scope of the presently disclosed embodiments.

For simplicity and clarity of illustration, the figures depict the general structure and/or manner of construction of the various embodiments. For ease of illustration, the figures depict the different layers/regions of the illustrated stacks as having a uniform thickness and well-defined boundaries with straight edges. However, a person skilled in the art would recognize that, in reality, the different layers typically have a non-uniform thickness. And, at the interface between adjacent layers, the materials of these layers alloy together, or migrate into one or the other material, making their boundaries ill defined. Descriptions and details of well-known features (e.g., interconnects, etc.) and techniques may be omitted to avoid obscuring other features. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and describe various processing steps. One skilled in the art would appreciate that the cross-sectional views are not drawn to scale and should not be viewed as representing proportional relationships between different regions/layers. Moreover, while certain regions/layers and features are illustrated with straight 90-degree edges, in actuality or practice such regions/layers may be more "rounded" and gradually sloping.

Figure 3:
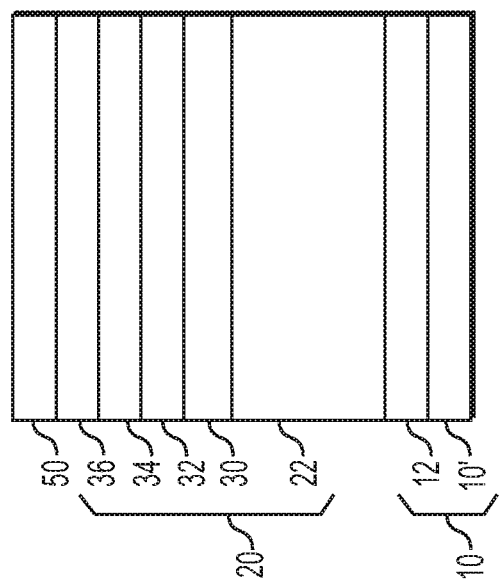

Further, one skilled in the art would understand that, although multiple layers with distinct interfaces are illustrated in the figures, in some cases, over time and/or exposure to high temperatures, materials of some of the layers may migrate into or interact with materials of other layers to present a more diffuse interface between these layers. It should be noted that, even if it is not specifically mentioned, aspects described with reference to one embodiment may also be applicable to, and may be used with, other embodiments.

Moreover, there are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment(s) is/are "example" embodiment(s). Further, even though the figures and this written disclosure appear to describe the disclose magnetoresistive stack/structures in a particular order of construction (e.g., from bottom to top), it is understood that the depicted magnetoresistive stack/structures may have the opposite order (e.g., from top to bottom). For example, a "fixed" magnetic region/layer may be formed on or above a "free" magnetic region or layer, which in turn may be formed on or above an insertion layer of the present disclosure.

Figure 2:
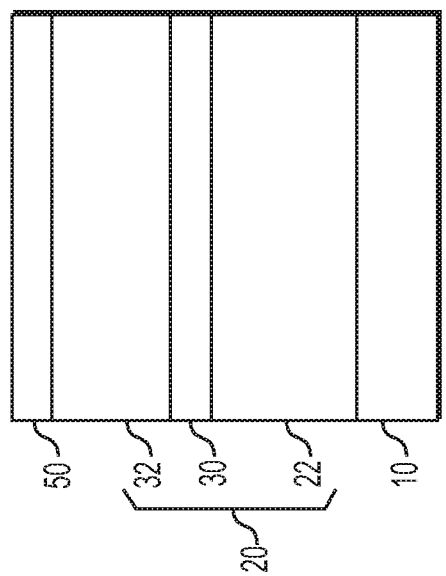
Figure 4:
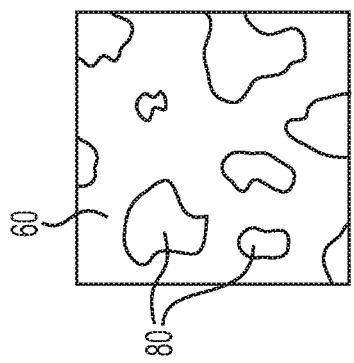
Figure 5A:
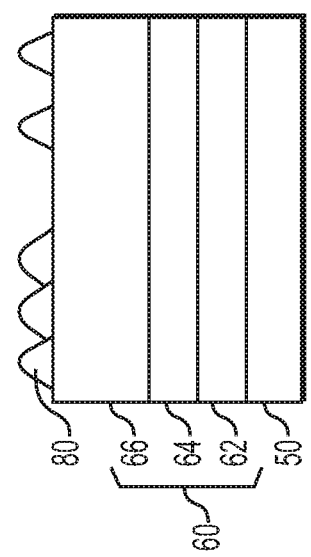
Figure 5B:
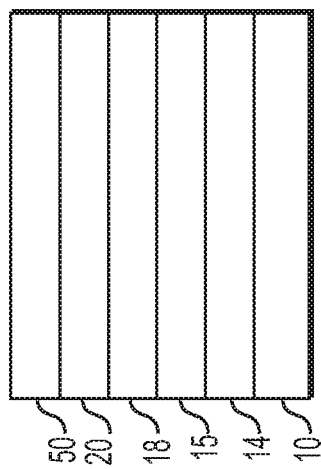
Figure 6A:
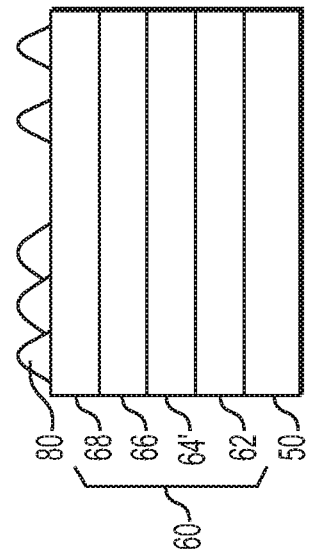
Figure 6B:
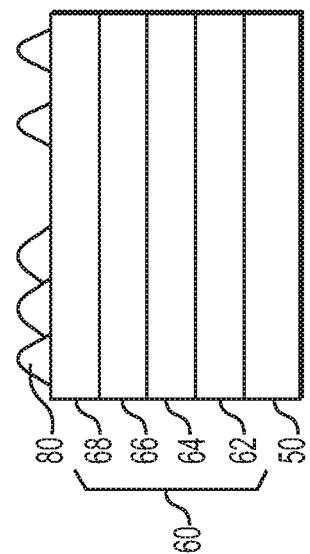
Figure 8:
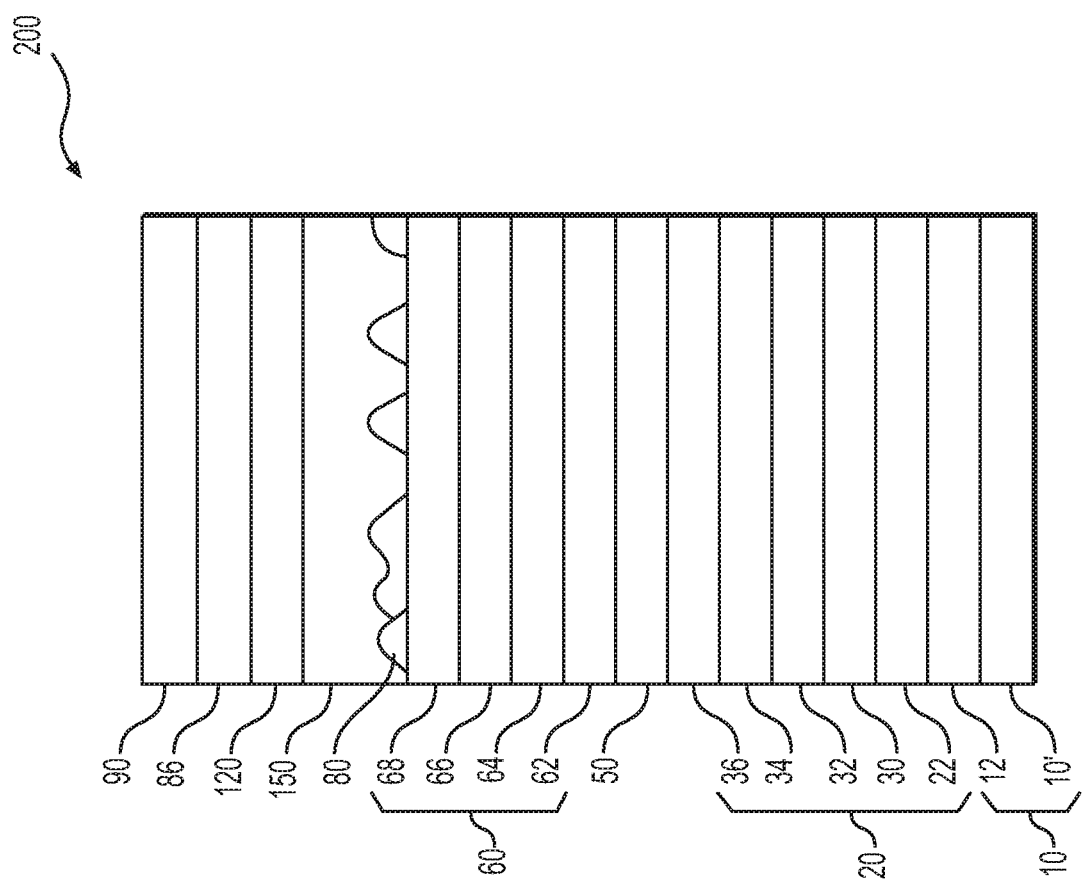
Figure 7:
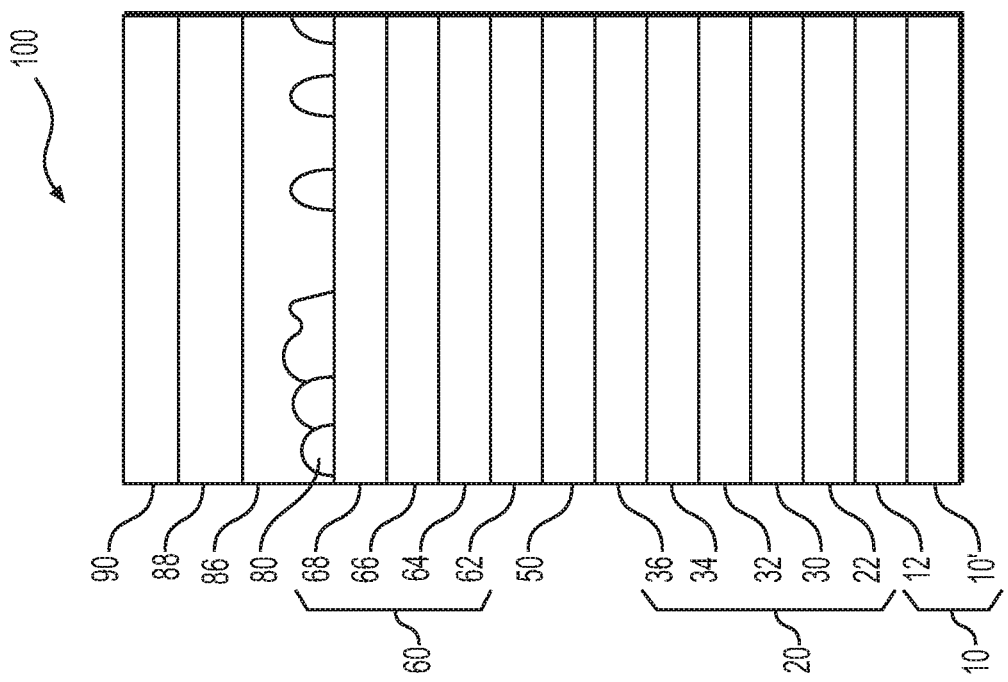
Figure 10A:
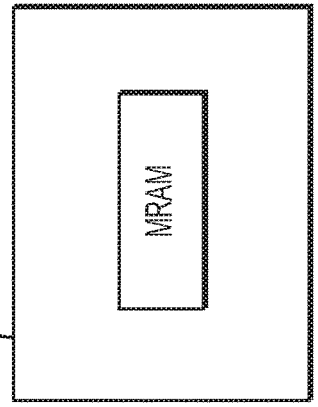
Figure 10B:
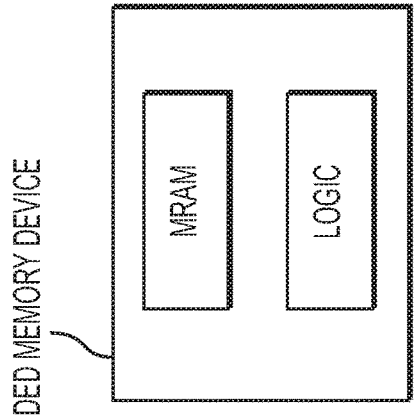
Figure 9:
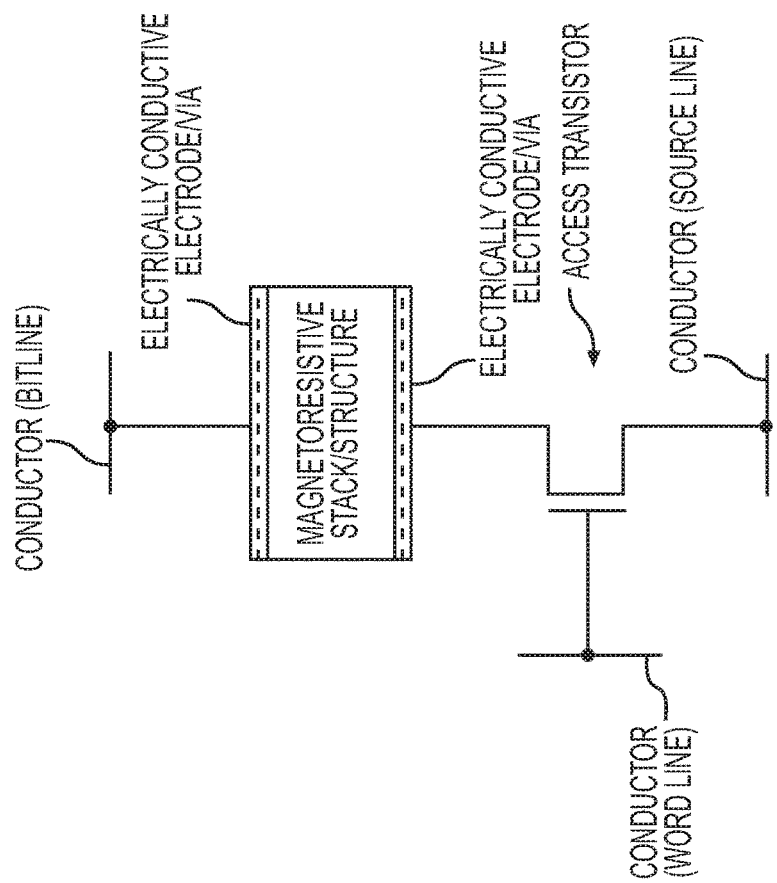
Figure 11:
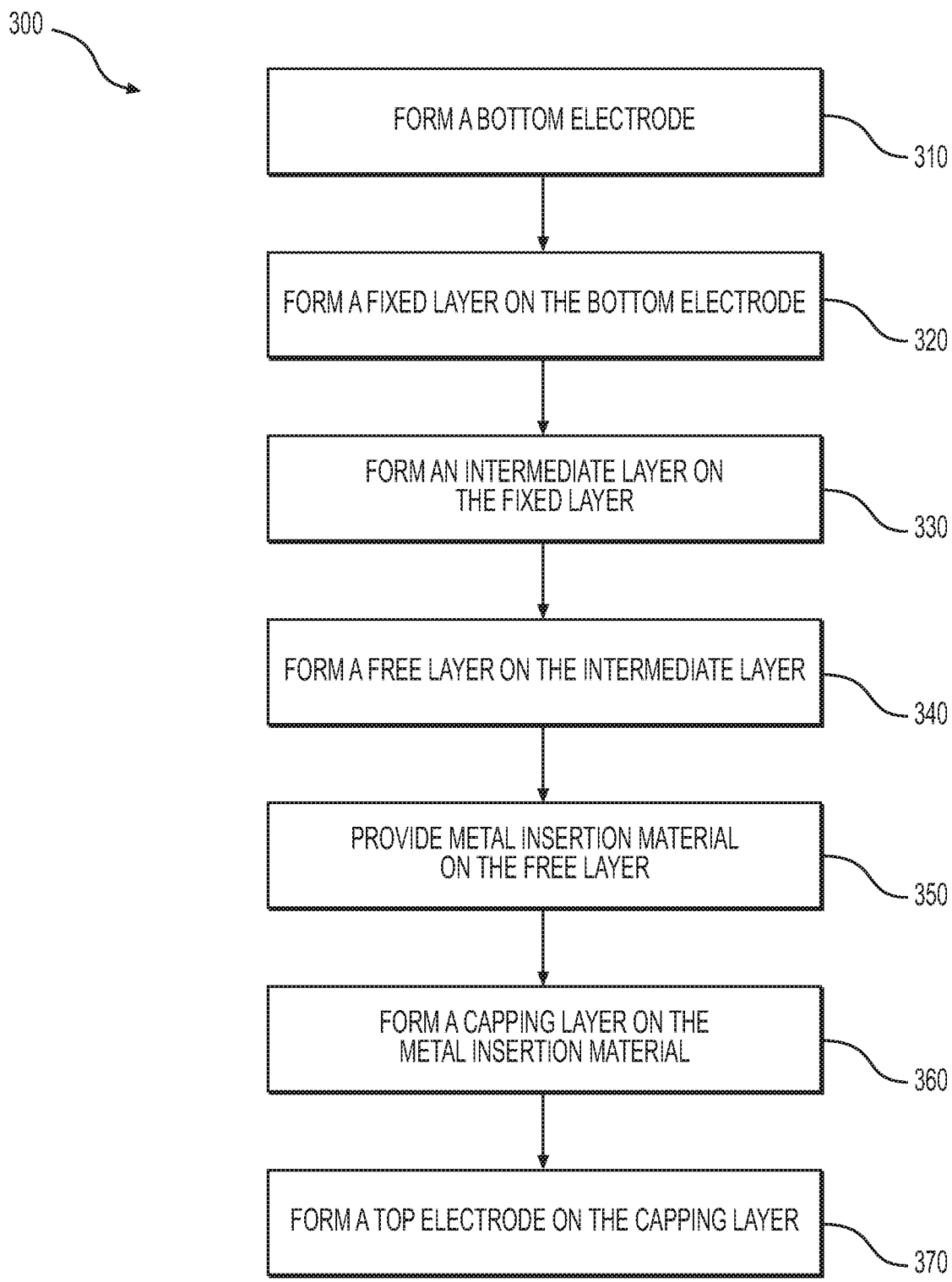
Figure 12:
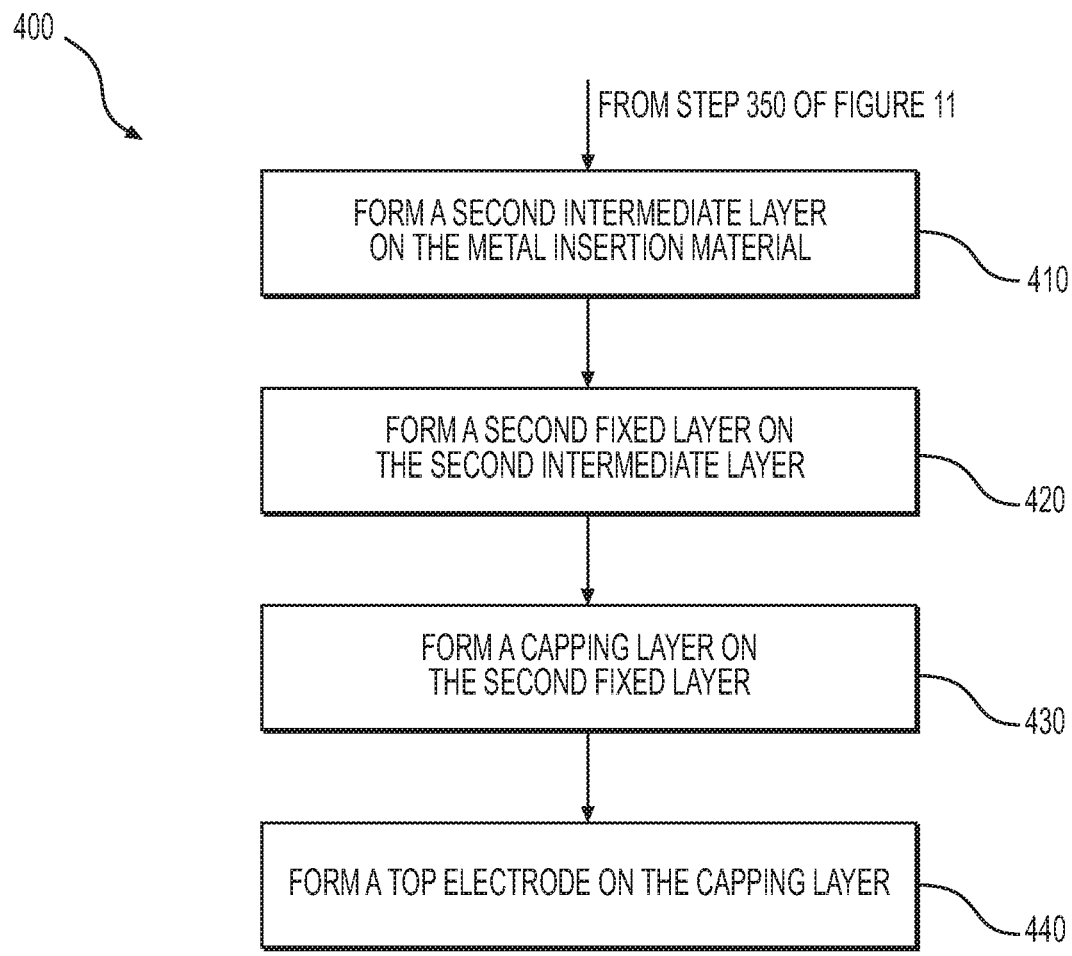

FIG. 1A illustrates a cross-sectional view of layers of an exemplary MTJ-type magnetoresistive stack/structure (for example, an in-plane or out-of-plane magnetic anisotropy magnetoresistive stack/structure (e.g., a perpendicular magnetic anisotropy magnetoresistive stack/structure)) including an intermediate layer (e.g., a dielectric layer), disposed between a "free" magnetic region (or layer) and a "fixed" magnetic region (or layer) wherein, in some exemplary embodiments, the "fixed" magnetic layer may be disposed between an electrode and an intermediate layer (which may be a tunnel barrier in the completed structure), according to at least certain aspects of certain embodiments described herein. In one or more exemplary embodiments, the MTJ-type magnetoresistive stack/structure is disposed between and in physical contact with one or more electrically conductive regions (e.g., electrodes, vias, lines) including (for example, in the context of electrodes or vias, tantalum, or an alloy thereof (such as a tantalum-nitride alloy), or a composite thereof (such as a tantalum (Ta) and tantalum-nitride (TaN) alloy composite)); notably, the "free" magnetic layer and the "fixed" magnetic layer may each include a plurality of layers of magnetic or ferromagnetic material(s) (for example, nickel (Ni), iron (Fe), cobalt (Co), palladium (Pd), platinum (Pt), magnesium (Mg), manganese (Mn), chromium (Cr), and alloys thereof) as well as one or more synthetic antiferromagnetic structures (SAF) or synthetic ferromagnetic structures (SyF), wherein one or more layers of magnetic materials layers may also include one or more non-magnetic materials layers (for example, ruthenium (Ru), copper (Cu), aluminum (Al), tantalum (Ta), titanium (Ti), niobium (Nb), vanadium (V), zirconium (Zr), iridium (Ir), and one or more alloys thereof, and in certain embodiments, tungsten (W) and molybdenum (Mo); moreover, the dielectric layers may be, for example, one or more layers of, for example, aluminum oxide ($Al_2O_3$), magnesium oxide (MgO), other metals oxides, or combinations thereof;

FIG. 1B illustrates another exemplary magnetoresistive stack/structure including an SOT switching line disposed near or adjacent to the "free" magnetic region;

FIG. 2 illustrates a cross-sectional view of exemplary layers that may be included in one exemplary "fixed" magnetic region/layer of the exemplary MTJ-type magnetoresistive stacks/structures depicted in FIGS. 1A-1B;

FIG. 3 illustrates a cross-sectional view of exemplary layers that may be included in another exemplary "fixed" magnetic region/layer of the exemplary MTJ-type magnetoresistive stacks/structures depicted in FIGS. 1A-1B, wherein the electrode may include a seed layer or region disposed at its interface with the "fixed" magnetic region/layer;

FIG. 4 illustrates a cross-sectional view of other exemplary layers (e.g., a pinning layer and a pinned layer) that may be included from the bottom electrode to the intermediate layer of the MTJ-type magnetoresistive stacks/structures depicted in FIGS. 1A-1B;

FIG. 5A illustrates a cross-sectional view of exemplary layers that may be included in one exemplary "free" magnetic region/layer of the exemplary MTJ-type magnetoresistive stacks/structures depicted in FIGS. 1A-1B, wherein an insertion substance may be disposed on or above the "free" magnetic region/layer, and wherein the "free" magnetic region/layer may be disposed on or above an intermediate layer, such as a dielectric layer (which in some embodiments may act as a tunnel barrier);

FIG. 5B illustrates a top-down view of exemplary layers that may be included in the exemplary MTJ-type magnetoresistive stacks/structures depicted in FIGS. 1A-1B;

FIG. 6A illustrates a cross-sectional view of exemplary layers that may be included in another exemplary "free" magnetic region of the exemplary MTJ-type magnetoresistive stacks/structures depicted in FIGS. 1A-1B, wherein an insertion layer may be provided in the "free" magnetic region/layer and an insertion substance may be disposed on or above the "free" magnetic region;

FIG. 6B illustrates a cross-sectional view of exemplary layers that may be included in another exemplary "free" magnetic region of the exemplary MTJ-type magnetoresistive stacks/structures depicted in FIGS. 1A-1B, wherein an insertion layer may be provided in the "free" magnetic region/layer and an insertion substance may be disposed on or above the "free" magnetic region;

FIG. 7 illustrates a cross-sectional view of exemplary layers of an exemplary MTJ-type magnetoresistive stack/structure of the current disclosure;

FIG. 8 illustrates a cross-sectional view of exemplary layers of an exemplary double spin filter MTJ-type magnetoresistive stack/structure of the current disclosure;

FIG. 9 is a schematic diagram of an exemplary magnetoresistive memory stack/structure electrically connected to an access transistor in a magnetoresistive memory cell configuration;

FIGS. 10A-10B are schematic block diagrams of integrated circuits including a discrete memory device and an embedded memory device, each including MRAM (which, in one embodiment is representative of one or more arrays of MRAM having a plurality of magnetoresistive memory stacks/structures, according to aspects of certain embodiments of the present disclosure; and FIGS. 11-12 are simplified exemplary manufacturing flows for the formation (e.g., via deposition) of layers of the exemplary MTJ-type magnetoresistive stack/structures described herein, according to at least certain aspects of certain embodiments of the present disclosure, wherein the various layers and/or regions are sequentially deposited, grown, sputtered, evaporated, and/or provided (used herein collectively as "deposited" or other verb tense (e.g., "deposit" or "depositing")) to provide the material stack that, after further processing, is an MTJ-type magnetoresistive stack/structure (having, for example, a perpendicular magnetic anisotropy).

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1t) to (t+0.1t) units. Further, all relative terms such as "about," "substantially," "approximately," etc. are used to indicate a possible variation of ±10% (unless noted otherwise or another variation is specified). Moreover, in the claims, values, limits, and/or ranges of the thickness and atomic composition of, for example, the described layers/regions, means the value, limit, and/or range ±10%.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item.

In this disclosure, the term "layer" is used generally to refer to one or more layers. That is, a layer (as used herein) may include a single layer (or coating) of material or multiple layers of materials stacked one on top of another to form a multi-layer system. Further, although in the description below, the different layers in the disclosed stack/structure are referred to by specific names (capping layer, reference layer, transition layer, etc.), this is only for ease of description and not intended as a functional description of the layer. Moreover, although the description below and the figures appear to depict a certain orientation of the layers relative to each other, those of ordinary skill in the art will understand that such descriptions and depictions are only exemplary. For example, though the "free" magnetic layer or region is depicted as being "above" an intermediate layer, in some aspects the entire stack may be flipped such that the intermediate layer is "above" the "free" magnetic layer or region.

As alluded to above, in one exemplary aspect, the magnetoresistive stack/structure of the present disclosure may be implemented as a spin-torque magnetoresistive random access memory ("MRAM") element ("memory element"). In such aspects, the stack/structure may include an intermediate layer positioned (or sandwiched) between two ferromagnetic regions/layers to form a magnetic tunnel junction (MTJ) device or an MTJ-type device. The intermediate layer may be a tunnel barrier and include an insulating material, such as, e.g., a dielectric material. In other embodiments, the intermediate layer may be a conductive material, e.g., copper, gold, or alloys thereof. In these other embodiments, where the magnetoresistive stack/structure includes a conductive material in between two ferromagnetic regions/layers, the magnetoresistive stack/structure may form a GMR or GMR-type device.

Of the two ferromagnetic regions disposed on either side of the intermediate layer, one ferromagnetic region/layer may be a magnetically "fixed" or pinned region, and the other ferromagnetic region/layer may be a magnetically "free" layer. As alluded to above, the term "free" is intended to refer to ferromagnetic regions having a magnetic moment that may shift or move significantly in response to applied magnetic fields or spin-polarized currents used to switch the magnetic moment vector. On the other hand, the words "fixed" and "pinned" are used to refer to ferromagnetic regions having a magnetic moment vector that does not move substantially in response to applied magnetic fields, spin-transfer torque, torque from spin-polarized currents, or current-induced spin-orbit torque originating from the strong spin-orbit coupling in heavy metals and their interfaces (e.g., an SOT switching line). As is known in the art, an electrical resistance of the described magnetoresistive stack/structure may change based on whether the magnetization direction (e.g., the direction of the magnetic moment) of the "free" region is in a parallel alignment or in an antiparallel alignment with the magnetization direction (e.g., the direction of the magnetic moment) of the "fixed" region. Typically, if the two regions have the same magnetization alignment, the resulting low resistance is considered as a digital "0," while if the alignment is antiparallel the resulting higher resistance is considered to be a digital "1." A memory device (such as an MRAM) may include multiple such magnetoresistive stacks/structures, which may be referred to as memory cells or elements, arranged in an array of columns and rows. By measuring the current through each cell, the resistance of each cell, and thus the data stored in the memory array can be read.

Switching the magnetization direction of the "free" region of a magnetoresistive stack/structure may be accomplished by driving a tunneling current pulse through the magnetoresistive stack/structure. The polarity of the current pulse determines the final magnetization state (i.e., parallel or antiparallel) of the "free" region. The mean current required to switch the magnetic state of the "free" region may be referred to as the critical current (Ic). The critical current is indicative of the current required to "write" data in (or the write current of) a magnetoresistive memory cell. Reducing the required write current(s) is desirable so that, among other things, a smaller access transistor can be used for each memory cell and a higher density, lower cost memory can be produced. Another way of switching the magnetization direction of the "free" region may be accomplished by current-induced spin-orbit torque (SOT) magnetization switching.

Magnetoresistance ratio (MR) is the ratio of the change in resistance of a magnetoresistive stack/structure between its high and low resistance states (MR=$(R_H-R_L)/R_L$, where $R_L$ and $R_H$ are the resistance of the magnetoresistive stack/structure in the low and high resistance states, respectively). MR is indicative of the strength of the signal when a memory element is "read." For an MTJ-type magnetoresistive stack/structure with a strong read signal, a larger MR (e.g., a larger difference between the individual resistances $R_H$ and $R_L$) is desirable. When the intermediate layer of magnetoresistive stack/structure is a tunnel barrier made of a dielectric material, the resistance may be measured by the resistance-area product (RA).

For the sake of brevity, conventional techniques related to semiconductor processing may not be described in detail herein. The exemplary embodiments may be fabricated using known lithographic processes. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or not exposed to the radiation, is removed by the application of a developer. An etch may then be performed whereby the layer not protected by the remaining resist is patterned. Alternatively, an additive process can be used in which a structure is built up using the photoresist as a template.

As noted above, in one aspect, the described embodiments relate to, among other things, methods of manufacturing a magnetoresistive stack/structure having one or more electrically conductive regions (e.g., electrodes, vias, or conductors) on either side of a magnetic material stack. As described in further detail below, the magnetic material stack may include many different layers of material, where some of the layers include magnetic materials, whereas others do not. In one embodiment, the methods of manufacturing include sequentially depositing, growing, sputtering, evaporating, and/or providing (as noted above, herein collectively "depositing" or other verb tense (e.g., "deposit" or "deposited")) layers and regions which, after further processing (for example, etching) those layers form a magnetoresistive stack/structure.

The magnetoresistive stacks/structures of the present inventions may be formed between a top electrode/via/line (e.g., electrode 90) and a bottom electrode/via/line (e.g., electrode 10) and, which permit access to the stack/structure by allowing for connectivity (for example, electrical) to circuitry and other elements of the magnetoresistive device. Between the electrodes/vias/lines are layers and/or regions, including at least one "fixed" magnetic region (which includes, among other things, a plurality of ferromagnetic layers), a seed region, at least one "free" magnetic region (which includes, among other things, a plurality of ferromagnetic layers), and one or more intermediate layers (e.g., one or more dielectric layers)—including at least one intermediate layer, disposed between the "fixed" magnetic region and the "free" magnetic region. The intermediate layer may function as a tunnel barrier layer between "fixed" magnetic region and "free" magnetic region. As explained in greater detail below, the magnetoresistive stacks/structures of the present inventions also include at least one insertion layer (e.g., formed of a metal, including a transition metal, such as, e.g., chromium (Cr) or iridium (Ir)) between the top electrode 90 and the "free" magnetic region 60.

FIG. 1A is a cross-sectional view of regions (or layers) of an exemplary MTJ-type magnetoresistive stack/structure 100 (for example, an in-plane or out-of-plane magnetic anisotropy magnetoresistive stack/structure (e.g., a perpendicular magnetic anisotropy magnetoresistive stack/structure)). It will be recognized that, for clarity, several other commonly-used regions (or layers) (e.g., various protective cap layers, seed layers, underlying substrate, etc.) have not been illustrated in FIG. 1A (and in subsequent figures). As illustrated in FIG. 1A, magnetoresistive stack/structure 100 may include multiple regions (or layers) arranged one over the other to form a stack of layers between a first electrode 10 and a second electrode 90. As shown in FIG. 1A, first electrode 10 may be a "bottom" electrode, and second electrode 90 may be a "top" electrode. However, those of ordinary skill in the art will recognize that the relative order of the various regions (or layers) of magnetoresistive stack/structure 100 may be reversed. Further, in some embodiments, the top electrode 90 (and/or the bottom electrode 10) may be eliminated, and the bit line may be formed on top of the stack. The bottom electrode 10 and top electrode 90 may comprise an electrically conductive material, and may be part of (or be in physical contact with) electrically conductive interconnects (e.g., vias, traces, lines, etc.) of magnetoresistive stack/structure 100 (e.g., as shown in FIG. 10). Although any electrically conductive material may be used for bottom electrode 10 and top electrode 90, in some embodiments, a metal such as tantalum (Ta), titanium (Ti), tungsten (W), or a composite or alloy of these elements (e.g., tantalum-nitride (TaN) alloy) may be used.

With continuing reference to FIG. 1A, "fixed" region 20 may be formed on or above bottom electrode 10. Although not illustrated in FIG. 1A, in some embodiments, bottom electrode 10 may be formed on a planar surface of a semiconductor substrate (e.g., silicon substrate, etc.). "fixed" region 20 may serve as a "fixed" magnetic region of magnetoresistive stack/structure 100. That is, a magnetic moment vector in the "fixed" region 20 does not move significantly in response to applied magnetic fields (e.g., an external field) or applied currents used to switch the magnetic moment vector of "free" region 60, as explained above. While the "fixed" region 20 of FIG. 1A is shown as a single layer, "fixed" region 20 may include several layers of a magnetic or a ferromagnetic material. In addition, "fixed" region 20 may include additional layers, including, but not limited to, an antiferromagnetic coupling layer, a reference layer, and/or a transition layer, as described below in greater detail, e.g., in connection with FIG. 3.

In some embodiments, the layers of "fixed" region 20 may include alloys that include cobalt (Co) and iron (Fe) (preferably cobalt (Co), iron (Fe), and boron (B)). In some embodiments, the composition of materials (e.g., cobalt (Co), iron (Fe), and boron (B)) in the "fixed" region 20 may be selected to achieve good temperature compensation. In some embodiments, these layers may also include, for example, alloys or engineered materials with one or more of palladium (Pd), platinum (Pt), magnesium (Mg), manganese (Mn), and chromium (Cr). Additionally or alternatively, in some embodiments, the "fixed" region 20 may include one or more synthetic antiferromagnetic structures (SAF) or synthetic ferromagnetic structures (SyF). Since SAFs and SyFs are known to those skilled in the art, additional description is omitted for sake of brevity.

In some embodiments, "fixed" region 20 also may include one or more non-magnetic material layers. For example, ruthenium (Ru), copper (Cu), aluminum (Al), tantalum (Ta), titanium (Ti), niobium (Nb), vanadium (V), zirconium (Zr), iridium (Ir), one or more alloys of these elements, and in certain embodiments, tungsten (W) and molybdenum (Mo).

In some embodiments, "fixed" region 20 may include a multi-layer structure of cobalt (Co) and platinum (Pt) or cobalt (Co) and nickel (Ni) (with or without other alloying elements). For example, in embodiments where "fixed" region 20 is a multi-layer structure of cobalt (Co) and platinum (Pt), "fixed" region 20 may include a cobalt (Co) layer (e.g., formed on or above a surface of electrode 10) followed by a platinum (Pt) layer formed on or above a surface of the cobalt ("Co") layer. In general, "fixed" region 20 may have any thickness. In some embodiments, the "fixed" region 20 may have a thickness in the range of between approximately 8 Å and approximately 300 Å, between approximately 15 Å and approximately 110 Å, greater than or equal to 8 Å, greater than or equal to 15 Å, less than or equal to 300 Å, or less than or equal to 110 Å. "fixed" region 20 may be deposited or formed using any technique now known or later developed; all of which are intended to fall within the scope of the present disclosure.

In some embodiments, such as the one shown in FIG. 1B, magnetoresistive stack/structure 100 may further include an SOT switching line 70 disposed next to, adjacent to, and/or in contact with "free" region 60. The SOT switching line 70 may include one or more heavy metals. In some embodiments, the SOT switching line 70 may include, for example, platinum (Pt), alloys of bismuth (Bi) including $Bi_xSe_{1-x}$, $(Bi_{0.5}Sb_{0.5})_2Te_3$, and $Bi_xSb_{1-x}$, beta-tungsten (β-W), beta-tantalum (β-Ta), or one or more alloys including tantalum (Ta), niobium (Nb), hafnium (Hf), zirconium (Zr), and/or titanium (Ti). The electrons flowing through the SOT switching line produce a spin current due to the strong spin-orbit coupling in the constituent metals and their interfaces. This spin current transfers its angular momentum to the adjacent "free" region 60, and thus switches the magnetization direction of the "free" region.

Turning now to FIG. 2, an exemplary embodiment of "fixed" region 20 having a plurality of layers is shown. It should be noted that, for the sake of clarity, only certain layers that comprise the "fixed" region 20, and only certain exemplary regions/layers on either side of the "fixed" region 20 (e.g., electrode 10 and intermediate layer 50) are illustrated in FIG. 2. Those of ordinary skill in the art will readily recognize that one or more additional layers, interface areas, and/or regions may be included within "fixed" region 20 and/or may be disposed between the layers of "fixed" region 20 and the depicted exemplary regions on either side of "fixed" region 20.

In one example, "fixed" region 20 may be a fixed, unpinned synthetic antiferromagnetic (SAF) region disposed on or above electrode 10. The fixed, unpinned synthetic antiferromagnetic (SAF) region may include at least two magnetic regions or layers 22, 32 (e.g., ferromagnetic layer 1 and ferromagnetic layer 2 in FIG. 2) separated by a coupling layer 30. One or more of magnetic regions or layers 22, 32 may include one or more of the ferromagnetic elements nickel (Ni), iron (Fe), and cobalt (Co), including alloys or engineered materials with one or more of the elements palladium (Pd), platinum (Pt), chromium (Cr), and alloys thereof. The coupling layer 30 may be an antiferromagnetic (AF) coupling layer including, e.g., non-ferromagnetic materials such iridium (Ir), ruthenium (Ru), or rhodium (Rh).

In some aspects at least one of the magnetic regions or layers 22, 32 may include a magnetic multi-layer structure including a plurality of layers (i) of a first ferromagnetic material (e.g., cobalt) and (ii) a second ferromagnetic material (e.g., nickel) or a paramagnetic material (e.g., platinum). For example, as shown in FIG. 3, magnetic region or layer 32 may include a multi-layer structure, as described in greater detail below.

In one embodiment, the interfacial layers of a multi-layer magnetic structure (e.g., layer 32 in FIG. 3) of the fixed, unpinned SAF region (for example, depending on the location of the multi-layer structure within the fixed unpinned SAF region—layers that are in contact or interface with bottom electrode 10, seed region 12, the AF coupling layer 30, transition layer 34, and/or the intermediate layer 50) include a layer of ferromagnetic material having a thickness which is greater than the thicknesses of one or more (or all) of the internal layers of the multi-layer magnetic region (i.e., layers of (i) of a first ferromagnetic material (e.g., cobalt) and (ii) a second ferromagnetic material (e.g., nickel (Ni)) or paramagnetic material (e.g., platinum). For example, in one embodiment, an interfacial layer of ferromagnetic material may include a thickness that is, for example, 15-30%, 20-40%, or 25-50% greater than the thickness of the internal layers of the multi-layer magnetic structure. Indeed, where the multi-layer magnetic structure includes layers of cobalt and layers of platinum, in one embodiment, interfacial layers of cobalt include a thickness (for example, a thickness which is greater than approximately 4 Å and less than approximately 8 Å), which is greater than the thickness of the internal layers, which may be alternating layers of platinum and cobalt. In one exemplary embodiment, the internal layers of platinum and cobalt include a thickness greater than approximately 2 Å and less than approximately 6 Å and preferably greater than approximately 2.5 and less than approximately 4.5 Å and more preferably approximately 3 Å.

In some embodiments, the multi-layer magnetic structure includes layers of nickel (Ni) and layers of cobalt (Co), and interfacial layers including nickel (Ni) may include a thickness (for example, greater than approximately 4 Å and less than approximately 8 Å), which is greater than a thickness of any or all of the internal layers combined. In one exemplary embodiment, the internal layers of cobalt and nickel include a thickness greater than 2 Å and less than 6 Å and preferably greater than 2.5 and less than 4.5 Å and more preferably 3 Å.

Notably, in one embodiment, only one of the interfacial layers of one or both multi-layer magnetic regions (e.g., layers 22, 32) of the fixed, unpinned SAF region includes a thickness which is greater than the thicknesses of one or more (or all) of the associated internal layers of the multi-layer magnetic structure of the fixed, unpinned SAF region.

In some embodiments, e.g., as described in greater detail below and shown in FIG. 3, electrode 10 of the magnetoresistive stack/structure 100 may include a seed region 12. In some embodiments, the top surface of electrode 10 itself may act as the seed region 12, e.g., when other seed region 12 is not provided. After deposition/formation of seed region 12, the overlying region or layer (e.g., "fixed" magnetic region 20) may be formed (e.g., deposited) on seed region 12 of electrode 10. The seed region layer 12 may assist in the formation of the "fixed" magnetic region or layer 20. As alluded to above, seed region 12 may be omitted if the overlying region or layer does not require assistance in being formed on electrode 10. The "fixed" magnetic region 20, as discussed above, may include a multi-layer, fixed unpinned SAF including a plurality of layers of one or more magnetic or ferromagnetic materials 22, 32 (for example, a multi-layer structure of (i) cobalt and platinum or (ii) cobalt and nickel separated by an AF coupling layer 30 (for example, an AF coupling layer 30 including non-ferromagnetic material such as ruthenium having a thickness of, for example, 4 Å (+/−1 Å)).

As alluded to above, some aspects of the present disclosure may include a seed region 12 disposed between bottom electrode 10 and "fixed" region 20. In practice, the seed region 12 may facilitate the formation of the "fixed" region 20 on the electrode 10. In embodiments where electrode 10 provides the desired growth characteristics for the subsequent layers, the seed region 12 may be omitted. Though seed region 12 is depicted in FIG. 3 as a single layer, those of ordinary skill in the art will understand that in some embodiments, seed region 12 also may include a multi-layer structure. The seed region 12 may include one or more of nickel, chromium, cobalt, iron, and alloys thereof (for example, an alloy including nickel and chromium). Further, seed region 12 may have a thickness which is greater than or equal to approximately 30 Å, greater than or equal to approximately 40 Å, greater than or equal to approximately 50 Å, or preferably greater than or equal to approximately 60 Å, more preferably greater than or equal to approximately 40 Å, or greater than approximately 50 Å and less than or equal to approximately 100 Å, approximately 40 Å to approximately 60 Å, or even more preferably greater than or equal to approximately 60 Å and less than or equal to approximately 100 Å, or most preferably approximately 60 Å (+/−10%). As depicted in FIG. 3, the seed region 12 may be disposed between and in physical contact with an electrically conductive metal material of an electrode/via/line (e.g., electrode 10) and "fixed" magnetic region 20.

In addition, "fixed" magnetic region 20 may include a transition layer 34 and/or a reference layer 36 disposed between magnetic layer 32 and intermediate layer 50 (e.g., a dielectric layer which may form a tunnel barrier). The transition layer 34 and/or reference layer 36 may include one or more layers of material that, among other things, facilitate/improve growth of the intermediate layer 50 during fabrication. In one embodiment, reference layer 36 includes one or more or all of cobalt (Co), iron (Fe), and boron (B) (for example, in an alloy—such as an amorphous alloy (e.g., CoFeB or CoFeBTa or CoFeTa)). In one or more embodiments, transition layer 34 may include a non-ferromagnetic transition metal such as tantalum (Ta), titanium (Ti), tungsten (W), ruthenium (Ru), niobium (Nb), zirconium (Zr), and/or molybdenum (Mo).

In some embodiments, reference layer 36 also may include a multi-layer structure. For example, reference layer 36 may include a layer of iron (Fe) (for example, deposited as pure or substantially pure iron) and a layer of cobalt (Co), iron (Fe), and boron (B) (for example, deposited as an alloy), wherein, after further/final processing (e.g., after annealing), the layer of iron (Fe) at the interface may form a continuous atomic layer or may mix with the underlying ferromagnetic alloy in the final annealed structure, resulting in a high-iron interface region within reference layer 36 which layer is adjacent to the intermediate layer 50. For example, the high-iron interface region may have an iron (Fe) content greater than or equal to 90 atomic percent (at. %), greater than or equal to 95 at. %, greater than or equal to 99 at. %, or greater than or equal to 99.9 at. %. Notably, the reference layer 34 and/or transition layer 36 may be implemented/employed in any of the embodiments described herein.

In some embodiments, transition layer 34 may be formed by depositing (or by another process) one or more non-ferromagnetic layers that may alloy with one or more of the neighboring ferromagnetic layers (e.g., layer 32), for example, during or in conjunction with one or more subsequent annealing processes to thereby form transition layer 34. In some embodiments, an alloy material may be directly deposited as the transition layer 34 and/or reference layer 36. In general, transition layer 34 and the reference layer 36 may have any thickness. In some embodiments, transition layer 34 has a thickness of approximately 1-8 Å, preferably approximately 1.5-5 Å, and more preferably approximately 2.5-3.5 Å. In some embodiments, a reference layer 36 may have a thickness of approximately 6-13 Å, preferably approximately 8-12 Å, and more preferably approximately 9-9.5 Å. In some embodiments where an alloy material is directly deposited as the transition layer 34, the thickness of transition layer 34 may be approximately 8 Å. In some embodiments, transition layer 34 and/or reference layer 36 may have a sub-atomic thickness. It should be noted that the exemplary thickness values discussed above are expected values of layer thicknesses immediately after deposition. As a person skilled in the art would recognize, in some cases, after deposition (over time and/or after exposure to high temperatures, etc.), the material of the deposited layer may migrate into (diffuse, etc.) adjoining layers (e.g., underlying layer, etc.) to form an alloy or an adjoining layer with a region having a higher concentration of the deposited material. In such embodiments, although the transition and reference layers 34, 36 may appear as distinct layers immediately after formation of these layers, after subsequent processing operations (e.g., annealing), these layers may mix or alloy together to form a single alloyed layer with (or separate from) the "fixed" region 20. Thus, in some cases, it may be difficult to distinguish layers 34 and 36 as being separate from the "fixed" region 20 in a finished magnetoresistive stack/structure 100 of the present disclosure. Instead, a region at the interface of the "fixed" region 20 and its overlying layer (e.g., intermediate layer 50 in FIG. 3) may have a greater concentration of the material(s) that forms the transition layer 34 and/or the reference layer 36.

The reference layer 36 and/or transition layer 34 may be deposited using any technique now known or later developed; all of which are intended to fall within the scope of the present inventions. However, it may be advantageous to deposit one or both of the reference layer 36 and transition layer 34 of the fixed magnetic region using a "heavy" inert gas (for example, xenon (Xe), argon (Ar), and/or krypton (Kr)). In one embodiment, the reference layer 36 and/or transition layer 34 may be deposited using the "heavy" sputtering inert gas. In addition thereto, the reference layer 36 and/or transition layer 34 also may be deposited at room temperature (for example, 15-40° C., and more preferably 20-30° C., and most preferably 25° C. (+/−10%)) or an elevated temperature (e.g., 40-60° C.).

Moreover, it may be advantageous to deposit one or more (or all) of the magnetic layers of the "fixed" region 20 using a "heavy" inert gas (for example, xenon (Xe)), for example, at room temperature (e.g., 15-40° C., more preferably 20-30° C., or most preferably 25° C. (+/−10%)) or a conventional/typical elevated temperature. Indeed, in one embodiment, the AF coupling layer 30 may also be deposited using a "heavy" inert gas (for example, xenon (Xe), argon (Ar), and/or krypton (Kr)), at room temperature (e.g., 20-30° C.) or an elevated temperature.

In some embodiments, as illustrated in FIG. 4, a pinned layer 15 and a pinning layer 14 may be provided between "fixed" region 20 and bottom electrode 10, with an AF coupling layer 18 magnetically separating pinned layer 15 and "fixed" region 20. Although "fixed" region 20 is illustrated as a single layer, as explained above, "fixed" region 20 may include a multi-layered structure. Pinned layer 15 may include one or more of cobalt (Co), iron (Fe), boron (B), and/or alloys thereof. Pinning layer 14 may include an antiferromagnetic alloy such as, for example, PtMn or IrMn. In general, pinning layer 14 and the pinned layer 15 may have any suitable thickness. For example, pinned layer 15 may have a thickness of approximately 8 Å to approximately 100 Å, preferably approximately 15 Å to approximately 40 Å, and more preferably approximately 20 Å to approximately 30 Å. In some embodiments, pinning layer 14 may have a thickness of approximately 60-300 Å, preferably of approximately 100-240 Å, and more preferably of approximately 160-200 Å. As is known to those of ordinary skill in the art, pinning layer 14 and pinned layer 15 may act as a ferromagnetic polarizer where pinning layer 14 fixes or pins the direction of the magnetization vector of pinned layer 15 and "fixed" region 20.

With renewed reference to FIGS. 1A-1B, a "free" region 60 (or storage region or layer) may be arranged above "fixed" region 20. An intermediate layer 50 may be positioned in between "fixed" region 20 and "free" region 60. In some embodiments, the intermediate layer 50 may include dielectric material and may function as a tunnel barrier in an MTJ or MTJ-like structure. In alternative embodiments, the intermediate layer 50 may include a conductive material, e.g., copper, to form a GMR-type magnetoresistive stack/structure. Intermediate layer 50 may be formed on or above a surface of the "fixed" region 20, and the "free" region 60 may be formed on or above a surface of the intermediate layer 50. In general, intermediate layer 50 may be formed on the "fixed" region 20 using any technique now known (e.g., deposition, sputtering, evaporation, etc.) or later developed. In some embodiments, intermediate layer 50 may include an oxide material, such as, for example, MgO or $AlO_x$ (e.g., $Al_2O_3$), and may be formed by multiple steps of material deposition and oxidation. In general, intermediate layer 50 may have any thickness. In some embodiments, the intermediate layer 50 may have a thickness of approximately 8.5-14.1 Å, preferably of approximately 9.6-13.0 Å, and more preferably of approximately 9.8-12.5 Å.

The "free" region 60 (or "free" magnetic layer) may include one or more ferromagnetic layers. Notwithstanding the specific construction of "free" region 60, "free" region 60 may include a magnetic vector (or moment) that can be moved or switched by applied magnetic fields, spin-transfer torque from spin-polarized currents, or current-induced spin-orbit torque. The "free" region 60 may be formed from any ferromagnetic material having two or more stable magnetic states. As with conventional magnetoresistive stacks/structures, the direction of the magnetization (i.e., the magnetic vector/moment) of the "free" region 60 determines the resistance of magnetoresistive stack/structure 100. In practice, for a two-state device, the direction of the magnetization of "free" region 60 is either parallel or anti-parallel to the magnetization (i.e., the magnetic vector/moment) of the "fixed" region 20, resulting in a low or high resistance representing a "0" bit state or a "1" bit state, respectively. "free" region 60 may include a magnetic easy axis that defines a natural or default axis of magnetization for "free" region 60. When magnetoresistive stack/structure 100 is in a steady state condition (e.g., with no current applied across electrodes 10, 90), the magnetization vector of "free" region 60 will point along its easy axis. In some embodiments, for example those implemented in perpendicular spin-torque devices, "free" region 60 may have a strong perpendicular magnetic anisotropy (PMA) such that its easy axis is perpendicular to the film plane and the two stable magnetic states are characterized by a magnetization vector directed generally toward or away from the intermediate layer 50. It is known that increasing the PMA of the "free" region 60 may beneficially increase the high temperature data retention capabilities of the magnetoresistive stack/structure 100, e.g., when magnetoresistive stack/structure 100 is implemented as a memory element.

In some aspects, "free" region 60 may include one or more layers of magnetic or ferromagnetic material(s). These materials may include alloys of one or more of the ferromagnetic elements nickel, iron, and cobalt. In some embodiments, one or more layers of "free" region 60 also may include boron. Additional elements may be added to the alloys to provide improved magnetic, electrical, or microstructural properties. The one or more layers of "free" region 60 may also include alloys or engineered materials with one or more of, for example, palladium (Pd), platinum (Pt), magnesium (Mg), manganese (Mn), and chromium (Cr). In some embodiments, similar to "fixed" region 20, "free" region 60 may also include one or more SAF or SyF structures. In one or more embodiments, "fixed" region 20 may include one or more layers of non-magnetic materials, such as, for example, ruthenium (Ru), copper (Cu), aluminum (Al), tantalum (Ta), titanium (Ti), niobium (Nb), vanadium (V), zirconium (Zr), iridium (Ir), tungsten (W), molybdenum (Mo), and alloys thereof. In some embodiments, "free" region 60 may be formed of materials that provide a strong PMA. These materials may include ordered L10 alloys (such as, for example, FePt, FePd, CoPt, or FeNiPt), artificial multi-layered structures (such as, Co/Pt, Co/Pd, CoCr/Pt, Co/Au, or Ni/Co), and alloys of CoFeB. In some embodiments, "free" region 60 may include alloys of CoFeB. In general, "free" region 60 may have any thickness. In some embodiments, "free" region 60 may have a thickness from approximately 7 Å to approximately 40 Å, from approximately 20 Å to approximately 30 Å, or from approximately 25 Å to approximately 28.5 Å.

Although "free" region 60 is illustrated as a single layer in FIGS. 1A-1B, this is only exemplary. As alluded to above, some aspects of magnetoresistive stack/structure 100 may include a "free" region 60 formed of multiple layers stacked one over the other. FIG. 5 illustrates an exemplary multilayer structure for "free" region 60. Similar to FIGS. 2-4, only certain layers that make up "free" region 60, and only certain layers/regions on either side of "free" region 60 (e.g., layers 50 and 80) are illustrated in FIG. 5A for the sake of clarity. As illustrated in FIG. 5A, "free" region 60 may comprise at least two ferromagnetic layers 62, 66 separated by a coupling layer 64. Coupling layer 64 may provide either ferromagnetic coupling or antiferromagnetic coupling between layers 62, 66.

Coupling layer 64 may include any nonmagnetic material (now known or developed in the future) that can provide coupling (e.g., ferromagnetic or antiferromagnetic) between two adjacent ferromagnetic layers 62, 66. In some embodiments, coupling layer 64 may include materials such as tantalum (Ta), tungsten (W), molybdenum (Mo), ruthenium (Ru), rhodium (Rh), rhenium (Re), iridium (Ir), chromium (Cr), osmium (Os), and combinations thereof. Although two ferromagnetic layers 62, 66 are illustrated in FIG. 5, in general, "free" region 60 may have any number of ferromagnetic layers with respective coupling layers provided between adjacent ferromagnetic layers. In general, ferromagnetic layers 62, 66 and coupling layer 64 may have any thickness. Typically, the thickness of coupling layer 64 is chosen to provide strong ferromagnetic or antiferromagnetic coupling between the two ferromagnetic layers 62, 66 on either side of the coupling layer 64. In some embodiments, ferromagnetic layers 62 and 66 may have a thickness of approximately 3-30 Å, or preferably approximately 6-17 Å, or more preferably approximately 8-15 Å. Coupling layer 64 may have a thickness of approximately 1-12 Å, or preferably approximately 2-6 Å, or more preferably approximately 2.5-4 Å. In some embodiments, the thickness of coupling layer 64 may be approximately 8 Å or approximately 9 Å. In general, the coupling layer 64 may comprise a thin layer (comprising, for example, tantalum (Ta), ruthenium (Ru), etc.) positioned between ferromagnetic layers 62, 66. The thickness of coupling layer 64 may be chosen such that it does not form a continuous layer, which would break or otherwise inhibit the exchange coupling between adjacent layers 62 and 66. Instead, the material of layer 64 may mix with the materials of layers 62 and 66 to form a uniform layer, or may form a layer that is not continuous, so that the adjacent ferromagnetic layers 62 and 66 are directly exchange coupled to each other and the entire structure acts as a single ferromagnetic "free" layer/region. In some embodiments, the deposited thickness of coupling layer 64 to achieve this effect is less than 3.5 Å, or from 1 Å to 3 Å. Other similar materials that form alloys with cobalt (Co), iron (Fe), or nickel (Ni) may yield similar results, for example: vanadium (V), zirconium (Zr), titanium (Ti), niobium (Nb), molybdenum (Mo), tungsten (W), hafnium (Hf), manganese (Mn), or chromium (Cr).

With reference now to FIGS. 1A-1B and 5A-5B, embodiments of magnetoresistive stack/structure 100 may include an insertion substance 80 provided on or above "free" region 60. In embodiments where "free" region 60 includes multiple ferromagnetic layers 62, 66 coupled together by a coupling layer 64 (e.g., see FIG. 5), insertion substance 80 may be provided on the top ferromagnetic layer 66 of "free" region 60. In some embodiments, insertion substance 80 may include a dusting of material over a surface of "free" region 60. That is, as opposed to a continuous monolithic layer of material (e.g., a monolayer, which would break the exchange between adjacent layers), insertion substance 80 may include a discontinuous layer with patches of material deposited on (or otherwise formed on) the surface of the "free" region 60. For example, in a plan view, the insertion substance 80 in FIG. 5A may appear as a patch work, or irregular areas, of material atop the "free" region 60 (which is exposed through gaps between the patches of the insertion substance 80). It should be noted that, although the different insertion substances 80 in FIGS. 1 and 5 are illustrated as having generally a similar size (e.g., height), this is only exemplary. In general, insertion substances 80 on "free" region 60 may have a various sizes, areas, and geometries. Referring to FIG. 1A-B, providing the insertion substance 80 between the "free" region 60 and a capping layer 86 may result in a high perpendicular magnetic anisotropy (PMA) of the resulting magnetoresistive stack/structure 100. In some embodiments, when the "free" region 60 includes iron (Fe) and the capping layer 86 includes magnesium oxide (MgO), the high PMA may be a result of the improved Fe/MgO interface (improved interfacial lattice matching and Fe—O hybridization at the interface). When an insertion substance 80 is inserted between the "free" region 60 and the capping layer 86, the thickness of insertion substance 80 should be less than one monolayer, so that the material of the capping layer 86 (e.g., magnesium oxide (MgO)) makes physical contact with (i.e., touches) the material of the "free" region 60 (e.g., iron (Fe)) in at least some regions or areas. In some embodiments, the material of the insertion substance 80 may alloy with a small region of material on the top surface (e.g., top monolayer) of the "free" region 60 and result in a better lattice match with the material of the capping layer 86. If the thickness of the insertion substance 80 is greater than one monolayer, the material of the capping layer 86 (e.g., magnesium oxide (MgO)) may not make physical contact with the material of the "free" region 60, and thus prevent the formation of a Fe/MgO interface and the resulting high PMA. Therefore, the thickness of the insertion substance 80 may be kept less than one monolayer.

Insertion substance 80 may include any suitable material, including, but not limited to, a metal, e.g., a transition metal. In general, any non-ferromagnetic transition metal element (e.g., a transition metal element that does not show ferromagnetism at room temperature) may be used to form insertion substance 80. As is known to those of ordinary skill in the art, transition metal elements comprise elements in the "d-block" of the periodic table, and the lanthanide and actinide series elements in the "f-block" of the periodic table. More specifically, insertion substance 80 may include, among others, scandium (Sc), titanium (Ti), vanadium (V), chromium (Cr), manganese (Mn), copper (Cu), zinc (Zn), yttrium (Y), zirconium (Zr), niobium (Nb), molybdenum (Mo), ruthenium (Ru), rhodium (Rh), palladium (Pd), silver (Ag), cadmium (Cd), indium (In), tin (Sn), antimony (Sb), lanthanum (La), cerium (Ce), praseodymium (Pr), neodymium (Nd), samarium (Sm), europium (Eu), terbium (Tb), dysprosium (Dy), holmium (Ho), erbium (Er), ytterbium (Yb), lutetium (Lu), hafnium (Hf), tantalum (Ta), tungsten (W), rhenium (Re), osmium (Os), iridium (Ir), platinum (Pt), gold (Au), mercury (Hg), thallium (Tl), lead (Pb), and bismuth (Bi). In some embodiments, the thickness of insertion substance 80 may be less than one atomic layer of the material selected. In embodiments where insertion substance 80 includes iridium (Ir), insertion substance 80 may have a thickness (t) less than approximately 3.33 Å, less than approximately 2 Å, less than approximately 1.75 Å, less than approximately 1.66 Å, or from approximately 0.1 to approximately 3.33 Å, from approximately 0.4 to approximately 1.7 Å, or from approximately 0.6 Å to approximately 1.0 Å, or approximately 0.8 Å. In embodiments where insertion substance 80 includes chromium (Cr), insertion substance 80 may have a thickness (t) less than approximately 1.44 Å, less than approximately 0.72 Å, or from approximately 0.1 Å to approximately 1.44 Å, or from approximately 0.2 Å to approximately 0.9 Å, or from approximately 0.3 Å to approximately 0.7 Å, or approximately 0.4 Å.

With renewed reference to FIGS. 1A-1B, magnetoresistive stack/structure 100 may further include a capping layer 86 (e.g., a dielectric layer), formed on or above insertion substance 80. Any suitable material may be used to form capping layer 86. For example, capping layer 86 may be formed from any suitable dielectric material, including, but not limited to, magnesium oxide (MgO) or aluminum oxide ($AlO_x$) ((e.g., $Al_2O_3$)). Capping layer 86 may have any suitable thickness. In some embodiments, capping layer 86 may have a thickness (t) of approximately 3-14 Å, or preferably approximately 5-12 Å, or more preferably approximately 6-10 Å.

Insertion substance 80 may, among other things, improve the bonding between the "free" region 60 and capping layer 86. More specifically, insertion substance 80 may improve the iron-oxygen (Fe—O) bonding at the interface of "free" region 60 and capping layer 86. The improved iron-oxygen (Fe—O) bonding at the interface of "free" region 60 and capping layer 86 may result in an increase in PMA without degrading MR effect and/or spin transfer torque. In some embodiments, incorporation of the insertion substance 80 is expected to increase the PMA between approximately 12% and approximately 60%. In some embodiments, an increase in interfacial anisotropy energy density ($K_s$, with typical units of erg/cm$^2$ in cgs units) of approximately 19% is expected to result in approximately 35% increase in effective magnetic anisotropy energy density ($Ku^{eff}$, having units of erg/cc in cgs units), and approximately 16% increase in anisotropy energy gap ($E_b$, usually it is measured in a unit of $k_BT$, like $E_b/k_BT$). It is contemplated that the improved iron-oxygen (Fe—O) bonding (and the resulting higher interfacial PMA) may be the result of a better lattice matching at the interface of "free" region 60 and capping layer 86. Moreover, it is believed that the improved interfacial bonding also may be the result of minimization (or prevention) of over-oxidation of iron (Fe) at the interface between "free" region 60 and capping layer 86. Still further, it is believed that the increased PMA results from insertion substance 80 optimizing the iron (Fe)—oxygen (O) distance between "free" region 60 and capping layer 86.

Although insertion substance 80 may be depicted as a discrete material with distinct boundaries in drawings, this may be to clearly illustrate insertion substance 80 despite its relatively small thickness. In some embodiments, the material of the insertion substance 80 may mix with and form an alloy with the material(s) of "free" region 60 (and/or capping layer 86) during downstream processing operations (e.g., annealing, etc.). In such cases, insertion substance 80 may appear as an alloyed region (e.g., an alloy of the materials of "free" region 60, insertion substance 80, and/or capping layer 86) at the interface between the capping layer 86 and "free" region 60. For example, when the "free" region 60 includes iron (Fe) and the insertion substance 80 includes chromium (Cr), after processing operations, in some embodiments the insertion substance 80 may alloy with iron (Fe) in a top surface of the "free" region 60 and appear a part of the "free" region 60 with a higher concentration of chromium (Cr) on the top surface.

Turning now to FIG. 6A, some embodiments of "free" region 60 may further include another ferromagnetic layer 68 provided on or above ferromagnetic layer 66. Stated differently, magnetoresistive stack/structure 100 may include a further ferromagnetic layer 68 between ferromagnetic layer 66 of "free" region 60 and insertion substance 80. In some embodiments, ferromagnetic layer 68 may include iron (Fe) (e.g., pure iron (Fe) or iron (Fe) in combination with other elements such as, for example, cobalt (Co), nickel (Ni), or boron (B)). For example, ferromagnetic layer 68 may have an iron (Fe) content greater than or equal to 90 at. %, greater than or equal to 95 at. %, greater than or equal to 99 at. %, or greater than or equal to 99.9 at. %. In some embodiments, layer 68 also may include one or more non-magnetic materials, such as, for example, boron (B), tantalum (Ta), zirconium (Zr), hafnium (Hf), or combinations thereof.

In some embodiments, ferromagnetic layer 68 may function magnetically as part of "free" region 60. In general, ferromagnetic layer 68 may have any thickness and may be formed as a continuous layer or a discontinuous layer (e.g., patches) over ferromagnetic layer 66. In some embodiments, ferromagnetic layer 68 may have a sub-atomic thickness. For example, ferromagnetic layer 68 may have a thickness from approximately 1.5 Å to approximately 7 Å, less than approximately 5 Å, or less than approximately 3 Å. Similar to that described above with reference to insertion substance 80, in some embodiments, after high temperature processing operations (e.g., annealing), ferromagnetic layer 68 may alloy with the materials of one or both of "free" region 60 and insertion substance 80. In such embodiments, ferromagnetic layer 68 may appear as a region of increased concentration of the material(s) of layer 68 (e.g., iron (Fe)) at the interface between "free" region 60 and insertion substance 80. As shown in FIGS. 1A-B, electrode 90 may be formed on or above capping layer 86 to complete the magnetoresistive stack/structure 100. As illustrated in FIG. 6B, in some embodiments, the coupling layer 64 between ferromagnetic layers 62 and 66 may be replaced with an insertion layer 64' (e.g., of tantalum (Ta), molybdenum (Mo), etc. having a thickness, for example, of approximately 3 Å). In some embodiments, insertion layer 64' may alloy with the adjacent ferromagnetic layers 62 and 66 during downstream processing operations (e.g., annealing) allowing the formation of a larger "free" region of layer 60.

Turning now to FIG. 7, there is depicted one exemplary embodiment of magnetoresistive stack/structure 100, having the exemplary "fixed" region 20 of FIG. 3 and the "free" region 60 of FIG. 6A. As those with ordinary skill in the art will recognize, magnetoresistive stack/structure 100 may have any suitable layers or configurations. For example, "fixed" region or layer 20 may have any structure or configuration, including those illustrated in any of FIGS. 1A-4. Similarly, "free" region 60 may have any structure or configuration, including those illustrated in any of FIGS. 1A-B and 5-7. In addition to the exemplary stacks/structure described herein, many other stacks/structures may be used in connection with the magnetoresistive stack/structure 100 and/or insertion substance 80 described herein. For example, U.S. Pat. Nos. 8,686,484; 9,136,464; and 9,419,208, each assigned to the assignee of the current application and incorporated by reference in its entirety herein, disclose several exemplary stacks/structures of magnetoresistive stack/structure 100 and methods of making such magnetoresistive stacks/structures 100. Specifically, "fixed" region 20 and "free" region 60 may have any of the structures/configurations disclosed in these references.

In some embodiments, magnetoresistive stack/structure 100 may include one or more additional layers, such as, e.g., spacer layer 88. As shown in FIG. 7, spacer layer 88 may be formed between electrode 90 and capping layer 86. In general, capping layer 86 may have any thickness and may be formed of any suitable material (e.g., MgO, $Al_2O_3$, $MgAlO_x$, or other suitable dielectric materials). In some embodiments, spacer layer 88 may be formed of a non ferromagnetic material, such as, e.g., ruthenium (Ru) or tantalum (Ta) or an alloy of ruthenium (Ru) or tantalum (Ta). In some embodiments, spacer layer 88 may include cobalt (Co), iron (Fe), boron (B), or an alloy thereof (e.g., CoFeB). In some embodiments, spacer layer 88 may include one or more materials or elements also included in capping layer 86. For example, both capping layer 86 and spacer layer 88 may include oxygen (O). In addition, spacer layer 88 may include one or more materials or elements not present in capping layer 86. For example, capping layer 86 may be formed of MgO, and spacer layer 88 may be formed of CoFeB. In some embodiments, the thickness of the spacer layer 88 may be approximately 5-50 Å, or preferably approximately 10-35 Å, or more preferably approximately 22-28 Å.

As previously explained, although the individual layers of FIG. 7 (and other figures) are illustrated as distinct layers with sharp well defined boundaries, typically, the materials of two adjacent layers at an interface (between the layers) may diffuse into each other, and present an interfacial region of an alloy or a combination of the materials of the two individual layers. Further, while all of the layers illustrated in FIG. 7 (and other figures) may be present and distinguishable immediately after formation of the individual layer, in some embodiments, it may be difficult to distinguish some of the layers (e.g., layers of sub-atomic thickness, such as, for example, layers 30, 64, 68, 80, 86, 88) as a separate layer in a finished product. Instead, these layers may appear as an interfacial region having a higher concentration of an element or material present in an adjacent layer.

As explained above, FIGS. 1 and 7 depict exemplary embodiments of a magnetoresistive stack/structure 100 having an insertion substance 80 (e.g., a metal), according to the present disclosure. The exemplary magnetoresistive stacks/structures 100 include a "fixed" region 20 and a "free" region 60 separated by an intermediate layer 50 (e.g., a dielectric layer) to form an MTJ-like device. As explained previously, an MTJ has a low resistance state and a high resistance state, and the ratio of the change in resistance between its high and low resistance states is commonly referred to as the magnetoresistance ("MR") of magnetoresistive stack/structure 100. Providing an insertion substance 80 (e.g., a metal such as a transition metal including, but not limited to, iridium (Ir) or chromium (Cr)) on or over "free" region 60 (e.g., above the MTJ formed by "fixed" region 20, "free" region 60, and intermediate layer 50) may increase the interfacial PMA at the interface of "free" region 60 and capping layer 86, without affecting the MR or the MR ratio of the MTJ.

In another embodiment of the present disclosure, aspects described herein may be used in connection with magnetoresistive stack/structure 200 depicted in FIG. 8. As alluded to above, magnetoresistive stack/structure 200 may include a magnetoresistive memory stack/structure or a magnetoresistive sensor/transducer stack/structure. When implemented as an MTJ or MTJ-like memory device, magnetoresistive stack/structure 200 may be referred to as a dual spin filter structure or a double spin filter structure. In some aspects, the dual spin filter structure of magnetoresistive stack/structure 200 may require less current to switch a magnetization direction a "free" region 60.

Magnetoresistive stack/structure 200 may include one or more regions or layers described in connection with magnetoresistive stack/structure 100. For example, magnetoresistive stack/structure 200 also may include a bottom electrode 10, a seed region 12, a "fixed" region 20, a first intermediate layer 50 (e.g., made of a dielectric material), a "free" region 60, insertion substance 80, capping layer 86 (and/or a spacer layer 88, see FIG. 7), and top electrode 90. One or more of bottom electrode 10, a seed region 12, a "fixed" region 20, a first intermediate layer 50 (e.g., made of a dielectric material), a "free" region 60, insertion substance 80, capping layer 86, and electrode 90 of magnetoresistive stack/structure 200 may include any aspect (e.g., material or thickness) described above in connection with magnetoresistive stack/structure 100. Those of ordinary skill in the art will understand that the intermediate layer 50 may include a conductor, e.g., copper, to form a GMR-type device.

As compared to magnetoresistive stack/structure 100, magnetoresistive stack/structure 200 may include a second intermediate layer 150 formed on or above insertion substance 80. In general, intermediate layer 150 may include the same material or a different material as intermediate layer 50. In some embodiments, both intermediate layer 50 and intermediate layer 150 may include a dielectric material (such as, for example, MgO) and may function as a tunnel barrier. However, this is not a limitation, in some embodiments, intermediate layer 50 and intermediate layer 150 may include different dielectric materials. For example, intermediate layer 50 may include MgO and intermediate layer 150 may include $AlO_x$ (e.g., $Al_2O_3$). In some embodiments, intermediate layer 150 also may be similar in thickness to intermediate layer 50. In other embodiments, intermediate layer 150 may have a thickness that is larger or smaller than the thickness of intermediate layer 50. In some embodiments, intermediate layer 150 may have a thickness of approximately 3-14 Å, preferably of approximately 5-12 Å, and more preferably of approximately 6-10 Å.

Magnetoresistive stack/structure 200 may include another "fixed" region or layer 120 formed on or above intermediate layer 150. Capping layer 86 and electrode 90 then may be formed on or above "fixed" region or layer 120. In some embodiments, as explained previously, a spacer layer 88 may be provided above the capping layer 86. Although fixed region or layer 120 is illustrated as a single layer, "fixed" region or layer 120 may include a multi-layered structure, e.g., as described in connection with one of FIGS. 2-4 above.

"fixed" region 20, intermediate layer 50, and "free" region 60 may together form a first MTJ (e.g., $MTJ_1$) having a first MR (e.g., $MR_1$) and a first RA (e.g., $RA_1$), and "fixed" region or layer 120, intermediate layer 150, and "free" region 60 may together form a second MTJ (e.g., $MTJ_2$) having a second MR (e.g., $MR_2$) and a second RA (e.g., $RA_2$). As those of ordinary skill in the art will recognize, the overall MR of magnetoresistive stack/structure 200 may be maximized when one MTJ (e.g., $MTJ_1$) dominates the resistance change by having a much larger resistance change than the other MTJ (e.g., $MTJ_2$) when the "free" region 60 changes state. This is usually accomplished by having a dominant MTJ, which includes both a larger MR and a larger RA than the other MTJ. One of the two MTJs may be made a dominant MTJ by suitable selection of the materials and/or thicknesses of the layers in the two MTJs. Since methods of making a dominant MTJ is known to those of ordinary skill in the art, they are not described herein. For example, U.S. Pat. No. 9,419,208, which is incorporated by reference herein, discloses exemplary methods of a making one of the two MTJs of a dual-spin filter memory element a dominant MTJ.

With specific reference to magnetoresistive stack/structure 200, $MTJ_1$ (i.e., the MTJ formed by "fixed" region 20, intermediate layer 50, and "free" region 60) may be a dominant MTJ as compared to $MTJ_2$ (i.e., the MTJ formed by "fixed" region or layer 120, intermediate layer 150, and the "free" region 60). The overall MR of magnetoresistive stack/structure 200 may increase when the MR of $MTJ_1$ increases and the MR of $MTJ_2$ decreases. Insertion substance 80, formed at the interface between the "free" region 60 and the intermediate layer 150 (of $MTJ_2$) may increase the PMA at the interface and decrease the MR of $MTJ_2$. However, since insertion substance 80 is provided above $MTJ_1$, insertion substance 80 may have no effect (or minimal effect) on the MR of $MTJ_1$. Thus, addition of insertion substance 80 increases the overall MR of magnetoresistive stack/structure 200 by reducing $MR_2$ as compared to $MR_1$.

As alluded to above, magnetoresistive stack/structure 100, 200 may be implemented in a sensor architecture or a memory architecture (among other architectures). For example, in a memory configuration, magnetoresistive stack/structure 100, 200 may be electrically connected to an access transistor and configured to couple or connect to various conductors, which may carry one or more control signals, as shown in FIG. 9.

Magnetoresistive stack/structure 100, 200 of the current disclosure may be used in any suitable application, including, e.g., in a memory configuration. In such instances, magnetoresistive stack/structure 100, 200 may be formed as integrated circuits comprising a discrete memory device (e.g., as shown in FIG. 10A) or an embedded memory device having a logic therein (e.g., as shown in FIG. 10B), each including MRAM, which, in one embodiment is representative of one or more arrays of MRAM having a plurality of magnetoresistive stacks/structures, according to certain aspects of certain embodiments disclosed herein.

Exemplary methods of fabricating selected embodiments of the disclosed magnetoresistive stack/structure 100, 200 will now be described. It should be appreciated that the described methods are merely exemplary. In some embodiments, the methods may include a number of additional or alternative steps, and in some embodiments, one or more of the described steps may be omitted. Any described step may be omitted or modified, or other steps added, as long as the intended functionality of the fabricated magnetoresistive stack/structure remains substantially unaltered. Further, although a certain order is described or implied in the described methods, in general, the steps of the described methods need not be performed in the illustrated and described order. Further, the described methods may be incorporated into a more comprehensive procedure or process having additional functionality not described herein.

FIG. 11 depicts a flow chart of an exemplary method 300 of fabricating magnetoresistive stack/structure 100. In the discussion below, reference will be made to both FIGS. 1A-B and 11. A first electrode (e.g., bottom electrode 10) may be first formed by any suitable process, including, e.g., deposition (step 310). In some embodiments, electrode 10 may be formed on a surface of a substrate that defines a plane. A "fixed" region or layer 20 then may be formed on an exposed surface of electrode 10 (step 320). That is, the "fixed" region or layer 20 may be formed on the surface of electrode 10 that is opposite the surface that interfaces with the surface of the substrate. An intermediate layer 50 then may be formed on an exposed surface of the "fixed" region or layer 20 (step 330), and a "free" region or layer 60 may be formed on an exposed surface of the intermediate layer 50 (step 340). Next, an insertion substance 80 (e.g., including a metal, such as, e.g., a transition metal, including chromium or iridium) then may be formed on an exposed surface of the "free" region or layer 60 (step 350), and a capping layer 86 may be formed atop (i.e., on an exposed surface of) the insertion substance 80 (step 360). A second electrode 90 then may be formed on a surface of the capping layer 86 (step 370). In some embodiments, the second electrode 90 may be eliminated and a bit line may be provided above the stack. It should be noted that, in embodiments where the "fixed" layer or region 20 and/or the "free" region or layer 60 includes a multi-layer configuration (e.g., as shown in FIGS. 2-3 and 5-7), steps 320 and 340 may include any suitable substeps (not shown) for forming the multiple layers that makeup "fixed" layer or region 20 and "free" region or layer 60.

FIG. 12 illustrates a flow chart of an exemplary method 400 of making magnetoresistive stack/structure 200. In method 400, steps 310 through 350 may first be carried out as described with reference to FIG. 11. After insertion substance 80 is formed (e.g., step 350 of FIG. 11), a second intermediate layer 150 may be formed over (e.g., on an exposed surface of) insertion substance 80 (step 410) (see, e.g., FIGS. 8 and 12). Second intermediate layer 150 may be formed such that the MR and the RA associated with intermediate layer 150 is less than the MR and RA associated with intermediate layer 50 (formed in step 330 of FIG. 11). Next, a second "fixed" region or layer 120 may be formed on an exposed surface of second intermediate layer 150 (step 420). A capping layer 86 then may be formed on an exposed surface of the second "fixed" region or layer 120, and a second (e.g., top) electrode 90 may be formed on an exposed surface of the capping layer 86. As explained with reference to FIG. 11, in some embodiments, the second electrode 90 may be eliminated and a bit line may be provided above the stack.

In some embodiments, magnetoresistive stack/structure 100, 200 may be fabricated by forming each succeeding layer directly on a surface of the layer/region below. For instance, with reference to FIG. 7, in some embodiments, seed region 12 may be formed directly on a surface (e.g., top surface in FIG. 7) of electrode 10, and ferromagnetic layer 22 may be formed directly on a top surface of seed layer 12, and so forth. Any suitable method may be used to form the different regions or layers. Since suitable integrated circuit fabrication techniques (e.g., deposition, sputtering, evaporation, plating, etc.) that may be used to form the different layers are known to those of ordinary skill in the art, they are not described here in great detail. In some embodiments, forming some of the layers may involve thin-film deposition processes, including, but not limited to, physical vapor deposition techniques such as ion beam sputtering and magnetron sputtering. And, forming thin insulating layers, such as the tunnel barrier layers, may involve physical vapor deposition from an oxide target, such as by radio-frequency (RF) sputtering, or by deposition of a thin metallic film followed by an oxidation step, such as oxygen plasma oxidation, oxygen radical oxidation, or natural oxidation by exposure to a low-pressure oxygen environment.

In some embodiments, formation of some or all of the layers of magnetoresistive stack/structure 200 may also involve known processing steps such as, for example, selective deposition, photolithography processing, etching, etc., in accordance with any of the various conventional techniques known in the semiconductor industry. In some embodiments, during deposition of the disclosed "fixed" and "free" regions or layers, a magnetic field may be provided to set a preferred easy magnetic axis of the region/layer (e.g., via induced anisotropy). Similarly, a strong magnetic field applied during the post-deposition high-temperature anneal step may be used to induce a preferred easy axis and a preferred pinning direction for any antiferromagnetically pinned materials.

Although various embodiments of the present disclosure have been illustrated and described in detail, it will be readily apparent to those skilled in the art that various modifications may be made without departing from the present disclosure or from the scope of the appended claims.

In some embodiments, a disclosed magnetoresistive device may comprise a fixed magnetic region, a free magnetic region, and an intermediate layer disposed in between the fixed magnetic region and the free magnetic region. The device may also include an insertion layer disposed on or above the free magnetic region. The insertion layer may include one of chromium or iridium, and the insertion layer may include a thickness less than 2 Å. In some embodiments, the disclosed device may include one or more of the following features: the intermediate layer may include a dielectric material; the intermediate layer may include a conductive material; the fixed magnetic region may include a multilayer synthetic antiferromagnetic structure; the thickness of the insertion layer may be 0.2 Å-0.7 Å; the thickness of the insertion layer may be less than 0.8 Å; the device may further include a capping layer disposed on or above the insertion layer, wherein the insertion layer is positioned between the capping layer and the free layer; the device may further include a second fixed region disposed on or above the insertion layer, wherein the insertion layer is positioned between the second fixed region and the free region.

In some embodiments, a method of manufacturing a magnetoresistive stack includes depositing a fixed magnetic region on an electrically conductive material, depositing a free magnetic region, and depositing an intermediate layer in between the fixed magnetic region and the free magnetic region. The disclosed method may also include depositing an insertion layer on or above the free magnetic region. The insertion layer may include one of chromium and iridium and may include a thickness less than 2 Å. Various embodiments of the disclosed method may also include one or more of the following aspects: the method may further include depositing a dielectric layer on or above the insertion layer, and depositing a second fixed region on or above the dielectric layer; the intermediate layer may include a dielectric material; the intermediate layer may include a conductive material; and the fixed magnetic region may include a multilayer synthetic antiferromagnetic structure.

What is claimed is:

1. A magnetoresistive device comprising:
   a fixed magnetic region positioned on or over a first electrically conductive region;
   an intermediate layer positioned on or over the fixed magnetic region;
   a free magnetic region positioned on or over the intermediate layer;
   a metal insertion substance positioned in contact with the free magnetic region, wherein the metal insertion substance includes one or more transition metal elements, and has a thickness less than or equal to approximately 3.33 Å; and
   a capping layer disposed on or over the metal insertion substance, wherein the capping layer comprises ruthenium (Ru).

2. The magnetoresistive device of claim 1, further comprising:
   a seed region disposed between the first electrically conductive region and the fixed magnetic region, wherein the seed region is in contact with both the first electrically conductive region and the fixed magnetic region; and
   a second electrically conductive region positioned above the metal insertion substance.

3. The magnetoresistive device of claim 1, wherein the one or more transition metal elements include at least one of chromium (Cr) or iridium (Ir).

4. The magnetoresistive device of claim 1, wherein the free magnetic region comprises:
   a first magnetic layer including iron (Fe), cobalt (Co), and/or boron (B);
   a coupling layer formed on or over the first magnetic layer, wherein the coupling layer includes tantalum (Ta), tungsten (W), molybdenum (Mo), ruthenium (Ru), rhodium (Rh), rhenium (Re), iridium (Ir), osmium (Os), or combinations thereof; and
   a second magnetic layer formed on or over the coupling layer, wherein the second magnetic layer includes iron (Fe), cobalt (Co), and/or boron (B).

5. The magnetoresistive device of claim 1, wherein the metal insertion substance is provided adjacent to an iron-rich region of the free magnetic region.

6. The magnetoresistive device of claim 1, further comprising an electrically conductive line positioned adjacent to the free magnetic region.

7. The magnetoresistive device of claim 1, further comprising an electrically conductive line positioned in contact with the free magnetic region.

8. The magnetoresistive device of claim 7, wherein the electrically conductive line is a spin-orbit torque line.

9. A magnetoresistive device comprising:
   a fixed magnetic region positioned on or over a first electrically conductive region;
   an intermediate layer positioned on or over the fixed magnetic region;
   a free magnetic region positioned on or over the intermediate layer, wherein the free magnetic layer comprises:
     a first magnetic layer including iron (Fe), cobalt (Co), and boron (B);
     a coupling layer formed on or over the first magnetic layer, wherein the coupling layer includes tantalum (Ta), tungsten (W), molybdenum (Mo), ruthenium (Ru), rhodium (Rh), rhenium (Re), iridium (Ir), osmium (Os), or combinations thereof; and
     a second magnetic layer formed on or over the coupling layer, wherein the second magnetic layer includes iron (Fe), cobalt (Co), and boron (B); and
   a metal insertion substance positioned in contact with the free magnetic region, wherein the metal insertion substance includes one or more transition metal elements.

10. The device of claim 9, wherein the metal insertion substance includes iridium (Ir), chromium (Cr), or both.

11. The device of claim 9, further comprising a seed region including nickel (Ni), chromium (Cr), cobalt (Co), or a combination thereof.

12. The device of claim 9, further comprising a capping layer disposed on or over the metal insertion substance, wherein the capping layer comprises ruthenium (Ru).

13. The device of claim 9, further comprising an electrically conductive line positioned in contact with the free magnetic region.

* * * * *